United States Patent
Takenaka et al.

(10) Patent No.: US 8,497,921 B2
(45) Date of Patent: Jul. 30, 2013

(54) IMAGE PICKUP DEVICE AND IMAGE PICKUP SYSTEM

(75) Inventors: Shintaro Takenaka, Yokohama (JP); Kazuhiro Sonoda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 203 days.

(21) Appl. No.: 13/047,599

(22) Filed: Mar. 14, 2011

(65) Prior Publication Data

US 2011/0228122 A1 Sep. 22, 2011

(30) Foreign Application Priority Data

Mar. 17, 2010 (WO) .................. PCT/JP2010/054528

(51) Int. Cl.
*H04N 5/228* (2006.01)
*H04N 5/335* (2011.01)

(52) U.S. Cl.
USPC ... 348/222.1; 348/294; 348/300; 348/E5.091; 250/208.1; 250/132

(58) Field of Classification Search
USPC ................. 348/222.1, 294, 300, 302, E5.031, 348/E5.091
See application file for complete search history.

(56) References Cited

U.S. PATENT DOCUMENTS

| | | | | |
|---|---|---|---|---|
| 5,665,959 A | * | 9/1997 | Fossum et al. | 250/208.1 |
| 6,166,367 A | * | 12/2000 | Cho | 250/208.1 |
| 7,598,998 B2 | * | 10/2009 | Cernasov et al. | 348/362 |
| 2007/0201090 A1 | * | 8/2007 | Shigematsu et al. | 358/1.15 |
| 2008/0284876 A1 | * | 11/2008 | Makino | 348/231.99 |

FOREIGN PATENT DOCUMENTS

JP 2008-288903 A 11/2008
WO 2009-034978 A1 3/2009

* cited by examiner

*Primary Examiner* — Hung Lam
(74) *Attorney, Agent, or Firm* — Canon USA Inc. IP Division

(57) ABSTRACT

When a conventional circuit is used in an image sensor which employs a pixel sharing technique, selection of pixels is not properly performed, that is, an invalid operation may be performed. To address this problem, a first storage unit which stores an address of a reading row, a second storage unit which stores an address of a shutter row, and a third storage unit for controlling an element shared by a plurality of pixels are provided in a row selection unit.

12 Claims, 11 Drawing Sheets

IMAGE PICKUP DEVICE AND IMAGE PICKUP SYSTEM

BACKGROUND OF THE INVENTION

1. Field of the Invention

The present invention relates to an image pickup device and an image pickup system.

2. Description of the Related Art

Examples of an image pickup device used in an electronic video camera or an electronic still camera include an MOS sensor or an X-Y address sensor. The X-Y address sensor obtains a signal from a pixel located at a specific position by specifying its address. With this feature, the X-Y address sensor realizes an "all pixel reading mode" in which signals of all pixels are obtained and a "reduced reading mode" in which (pixels in) some rows and columns are skipped and signals are obtained from other pixels.

In Japanese Patent Laid-Open No. 2008-288903, first storage means which stores an address on which shutter scanning is to be performed and a second storage means which stores an address on which reading scanning is to be performed are provided so as to perform a complicated shutter operation in the "reduced reading mode", for example. Furthermore, Japanese Patent Laid-Open No. 2008-288903 also discloses a pixel sharing technique of sharing a floating diffusion which temporarily holds charge stored in pixels and which is a part of the transistors included in the pixels by a plurality of pixels, and also, a circuit for selecting a pixel in the technique.

However, if the circuit disclosed in Japanese Patent Laid-Open No. 2008-288903 is used in an image sensor which employs the pixel sharing technique, selection of a pixel may not be properly performed, and accordingly, an invalid operation may be performed.

Therefore, a need exists for an image pickup device, an image pickup system, and a method for driving the image pickup device which prevents an invalid operation from being performed even when the pixel sharing technique is employed.

SUMMARY OF THE INVENTION

The present invention provides an image pickup device including a pixel array including a plurality of pixels arranged in a matrix, and a row selection unit which selects one of rows of the pixels and which includes an address generation unit which generates an address signal corresponding to an address of one of the pixel rows in a time division multiplex method, a decoder which decodes the address signal generated by the address generation unit and outputs a resultant decoded value, a first storage unit which stores the decoded value corresponding to the address of one of the pixel rows from which signals are to be read, and a second storage unit which stores the decoded value corresponding to the address of one of the pixel rows to be initialized. Among the pixels arranged in a matrix, a number of pixels included in adjacent rows form a plurality of pixel blocks having respective shared transistors, and the row selection unit further includes a third storage unit which stores the decoded value corresponding to one of the pixel blocks including the shared transistors.

Further features of the present invention will become apparent from the following description of exemplary embodiments with reference to the attached drawings.

BRIEF DESCRIPTION OF THE DRAWINGS

Various exemplary embodiments, features, and aspects of the invention will be described in detail below with reference to the drawings.

DESCRIPTION OF THE EMBODIMENTS

In order to clarify an advantage of the present invention, problems which may arise in the configuration disclosed in Japanese Patent Laid-Open No. 2008-288903 will now be described.

A technique of selecting, in a pixel region including pixels arranged in a matrix, pixels using a plurality of row selection units is generally used. A case where pixels in odd-numbered rows are selected using one of two row selection units and pixels in even-numbered rows are selected using the other of the selection units will be described as an example. Assuming that pixels in first and second rows adjacent to each other share a floating diffusion portion (hereinafter referred to as "FD portion"), the pixels in the first row are controlled by one of the row selection units and the pixels in the second row are controlled by the other of the row selection units.

When two pixels which share an FD portion are used as a single pixel block and a plurality of pixel blocks are arranged in a matrix, a shutter operation may be performed on a pixel in the first row included in a certain pixel block and the shutter operation may not be performed on a pixel in the second row included in the same pixel block.

When the circuit disclosed in Japanese Patent Laid-Open No. 2008-288903 is used in this case, in a circuit which controls pixels in the first row, a latch used to select a shutter row outputs "1" whereas in a circuit which controls pixels in the second row a latch used to select a shutter row outputs "0". Here, when a signal STR is input to perform a shutter operation, the circuit which controls the pixels in the first row outputs a signal RST of "1" whereas the circuit which controls the pixels in the second row outputs a signal RST of "0". That is, different signals are output from the two different selection circuits, and therefore, it is uncertain whether switches controlled by the signals RST are to be conductive or not. Accordingly, an invalid operation may be performed.

First Embodiment

A first embodiment of the present invention will be described with reference to the accompanying drawings.

Figure 1:
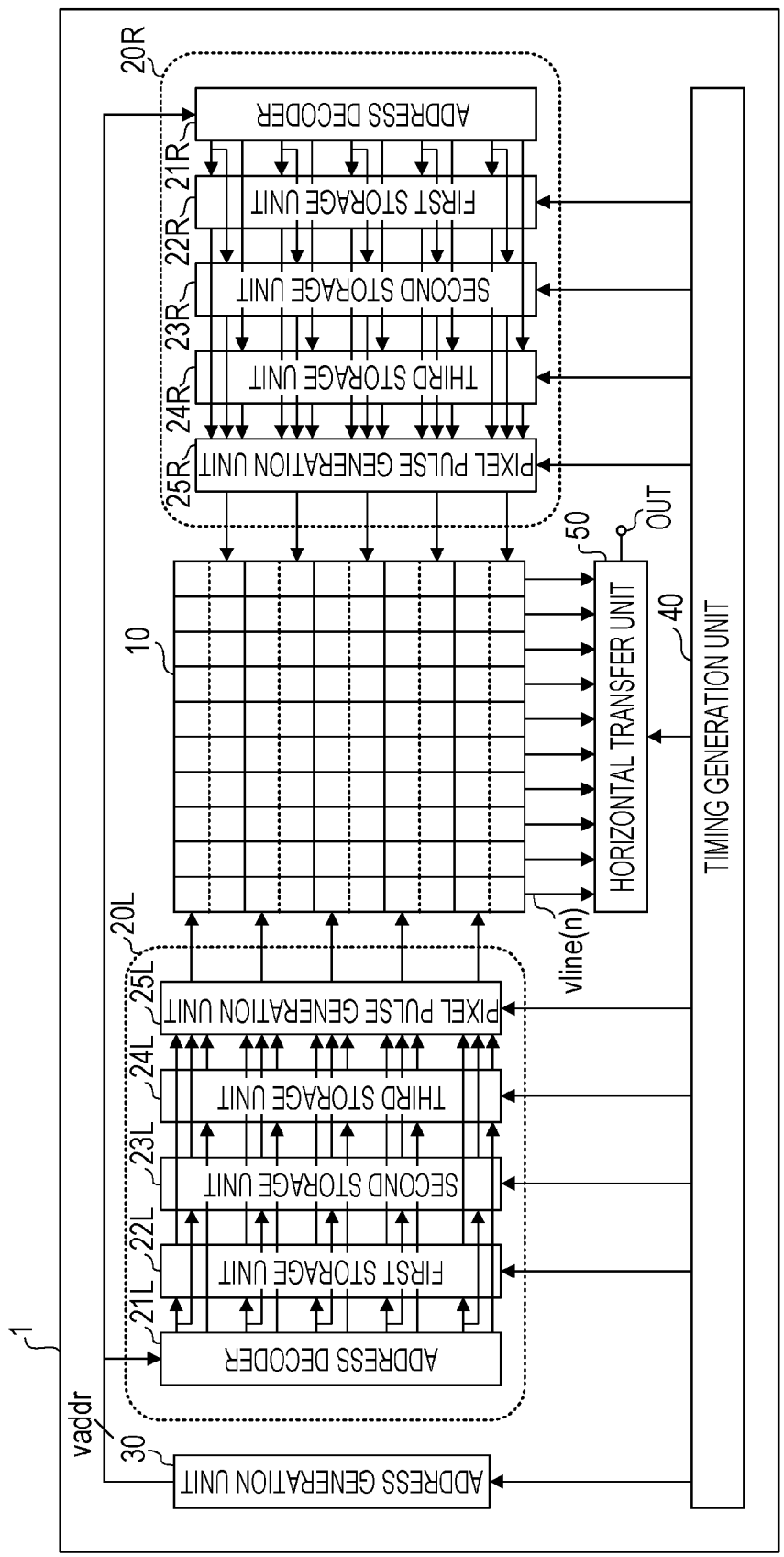
FIG. 1 is a block diagram schematically illustrating an image pickup device according to the present invention.

FIG. 1 is a block diagram schematically illustrating an image pickup device according to the present invention. An image pickup device 1 includes a pixel array 10, row selection units 20L and 20R, an address generation unit 30, a timing generation unit 40, and a horizontal transfer unit 50. These components may be arranged on the same semiconductor substrate, and some of them may be arranged on a different semiconductor substrate.

The pixel array 10 includes a plurality of pixels arranged in a matrix. Pixels in adjacent rows share circuits. Hereinafter, a plurality of pixels which share circuits are referred to as "pixel blocks". That is, the pixel array 10 includes a plurality of pixel blocks arranged in a matrix.

The row selection units 20L and 20R sandwich the pixel array 10 therebetween. The row selection unit 20L selects pixels in odd-numbered rows in the pixel array 10 whereas the row selection unit 20R selects pixels in even-numbered rows in the pixel array 10. Specifically, the row selection unit 20L serving as a first row-selection circuit and the row selection unit 20R serving as a second row-selection circuit are configured to alternately select the pixel rows in the pixel array 10.

Furthermore, the row selection unit 20L includes an address decoder 21L, a first storage unit 22L, a second storage unit 23L, a third storage unit 24L, and a pixel pulse generation unit 25L. The address decoder 21L outputs a decoded value obtained by decoding an address value generated by the address generation unit 30 and selects an address corresponding to the address value.

The first storage unit 22L stores the decoded value output from the address decoder 21L. An output of the first storage unit 22L is used as an address of a row from which signals are read from pixels included in the pixel array 10.

The second storage unit 23L stores the decoded value output from the address decoder 21L. An output of the second storage unit 23L is used as an address of a row in which photoelectric conversion units included in pixels in the pixel array 10 are reset.

The third storage unit 24L stores the decoded value output from the address decoder 21L. An output of the third storage unit 24L is used to control an element shared by a plurality of pixels included in a pixel block of the pixel array 10.

The address generation unit 30 generates an address value based on a signal supplied from the timing generation unit 40 and supplies the generated address value to the row selection units 20L and 20R. The address generation unit 30 outputs an address signal vaddr in a time division multiplex method so that a single address decoder selects a plurality of addresses. More specifically, the address generation unit includes a plurality of circuits which generate address values, selects an output of one of the circuits based on a signal supplied from the timing generation unit 40, and outputs the selected output as the address signal vaddr.

The timing generation unit 40 supplies a signal used to control a timing when the address generation unit 30 generates an address value and supplies a signal used to control operation timings of the row selection units 20L and 20R and the horizontal transfer unit 50.

The horizontal transfer unit 50 outputs signals read from the pixel array 10 through vertical signal lines vline (n) from an output terminal OUT. Specifically, the horizontal transfer unit 50 includes amplifiers, AD (analog to digital) converters, CDS (correlated double sampling) circuits, and line memory circuits which are provided for the individual vertical signal lines vline(n), and the signals read from the pixel array 10 are successively output from the output terminal OUT using a horizontal scanning circuit. The line memory circuits may be analog memories or digital memories such as SRAMs (static random access memories) and latch circuits.

The row selection units 20L and 20R have the same configurations with each other, and therefore, a description of the row selection unit 20R is omitted. The horizontal scanning circuit may be constituted by a decoder so that an arbitrary row may be accessed. By this, random access is realized in combination with the row selection units 20L and 20R. It is apparent that scanning is successively performed in order of address even when the row selection unit and the horizontal scanning circuit are constituted by decoders.

Figure 2:
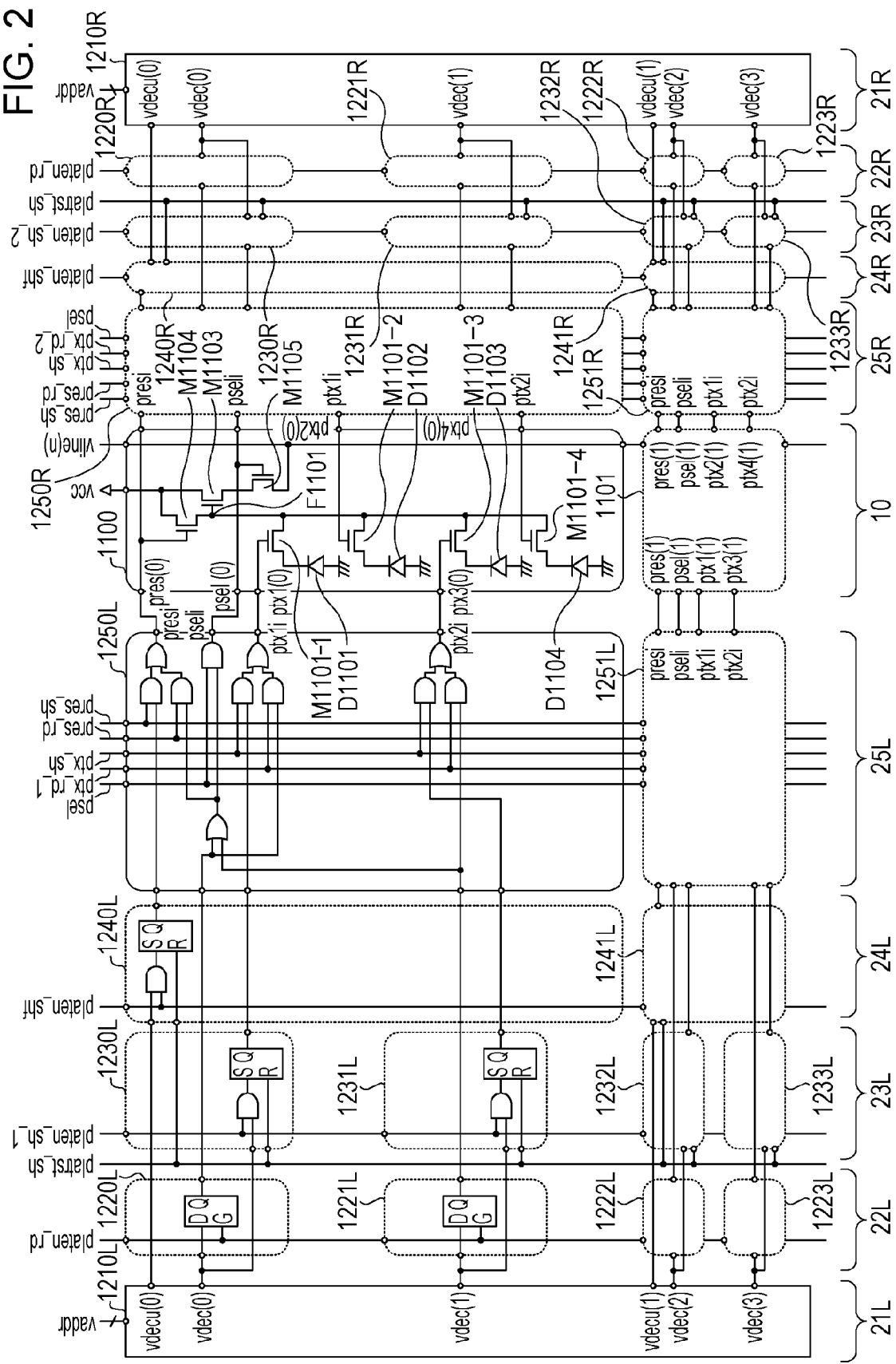
FIG. 2 is a circuit diagram illustrating a configuration of the image pickup device according to a first embodiment.

FIG. 2 is a circuit diagram of the configuration shown in FIG. 1 in detail except for the timing generation unit 40 and the horizontal transfer unit 50.

The pixel array 10 includes a plurality of pixel blocks 1100, 1101, and so on which are arranged therein, and in FIG. 2, pixel blocks arranged in a matrix of four rows and one column are extracted. The pixel block 1100 includes four pixels. A pixel in a first row includes a photodiode D1101 which is a photoelectric conversion unit, a transfer transistor M1101-1, an amplifying transistor M1103, a reset transistor M1104 serving as a reset unit, and a selection transistor M1105. When the transfer transistor M1101-1 is brought to a conductive state, a charge stored in the photodiode D1101 is transferred to a node of a gate of the amplifying transistor M1103. Although not shown, the gate of the amplifying transistor M1103 is connected to a floating diffusion portion serving as a first main electrode of the transfer transistor M1101-1 on a semiconductor substrate, and a charge of the photodiode is transferred to the floating diffusion portion. Hereinafter, the floating diffusion unit is referred to as an "FD portion". The amplifying transistor M1103 has a first main electrode which receives supply of a power voltage vcc and a second main electrode which is connected to one of the vertical signal lines vline(n) through the selection transistor M1105. When the selection transistor M1105 is brought to a conductive state, the amplifying transistor M1103 forms a source follower circuit together with a current source connected to the vertical signal line vline(n) and outputs a signal corresponding to a potential of the FD portion. A first main electrode of the reset transistor M1104 is connected to the FD portion. When being brought to a conductive state, the reset transistor M1104 resets the FD portion in accordance with a potential supplied to a second electrode. A pixel in the second row includes a photodiode D1102, a transfer transistor M1101-2, the amplifying transistor M1103, the reset transistor M1104 serving as a reset unit, and the selection transistor M1105. Similarly, each of the pixels in third and fourth rows includes a photodiode, a transfer transistor, the amplifying transistor, and the reset transistor. These four pixels share the amplifying transistor M1103, the reset transistor M1104, and the selection transistor M1105. As with the pixel block 1100, in each of the pixel blocks 1101, 1102, and so on, the amplifying transistor M1103, the reset transistor M1104, and the selection transistor M1105 are shared by pixels in adjacent four rows.

The address decoder 21L receives the address signal vaddr output from the address generation unit 30 based on a control signal supplied from the timing generation unit 40. The address signal vaddr is an n-bit signal, for example, represents a pixel block using higher (n−1) bits, and represents pixels within a pixel block using n bits. In FIG. 2, a decoded value vdecu(x) is set using n bits ($0 \leq x \leq (2^{(n-1)})-1$) and a decoded value vdec(y) is set using lower n bits ($0 \leq y \leq (2^n)-1$). Note that when a pixel block includes two pixels, the pixel block is represented by m bits of an address signal having m bits.

A plurality of first storage circuits 1220L, 1221L, and so on included in the first storage unit 22L include respective D latches which store 1-bit data. The D latch included in the first storage circuit 1220L has a D terminal connected to an output vdec(0) of the address decoder 21L and a G terminal connected to a line which transmits a signal platen_rd. The first storage circuits 1221L, 1222L, and so on similarly include the respective D latches but D terminals thereof are connected to different outputs of the address decoder 21L. The line which transmits the signal platen_rd is also connected in common to the other storage circuits 1221L, 1222L, and so on.

Second storage circuits 1230L, 1231L, and so on which are included in the second storage unit 23L include respective AND circuits and respective SR latches having S terminals connected to corresponding outputs of the AND circuits. A first input terminal of the AND circuit is connected to the output vdec(0) of the address decoder 21L and a second input terminal is connected to a line which transmits a signal platen_sh_1. An R terminal of the SR latch is connected to a line which transmits a signal platrst_sh_1. A line which transmits the signal platrst_sh is also connected in common to the other second storage circuits 1231L, 1232L, and so on included in the second storage unit.

Third storage circuits 1240L, 1241L, and so on included in the third storage unit 24L include respective AND circuits and respective SR latches having S terminals connected to outputs of the corresponding AND circuits. A first input terminal of the AND circuit is connected to an output vdecu(0) of the address decoder 21L and a second input terminal is connected to a line which transmits a signal platen_shf. An R terminal of the SR latch is connected to the line which transmits the signal platrst_sh. The lines which transmit the signals platen_shf and platrst_sh are also connected in common to the other third storage circuits 1241L, 1242L, and so on included in the third storage unit.

Each of pixel pulse generation circuits 1250L, 1251L, and so on included in the pixel pulse generation unit 25L includes AND circuits and OR circuits. However, the configurations of the circuits are not limited to the configuration of this embodiment. The pixel pulse generation circuit 1250L outputs signals presi, pseli, ptx1i, and ptx2i to be supplied to the pixel block 1100 as signals pres(0), psel(0), ptx1(0), and ptx3(0). The signal presi is generated as a logical OR of a logical AND of an output of an OR circuit which outputs a logical OR of the first storage circuits 1220L and 1221L and the signal pres_rd and a logical AND of an output of the third storage circuit 1240L and the signal pres_sh. The signal pseli is generated as a logical AND of the output of the OR circuit which outputs the logical OR of the first storage circuits 1220L and 1221L and the signal psel. Then, the ptx1i is generated as a logical OR of a logical AND of an output of the first storage circuit 1220L and the signal ptx_rd_1 and a logical AND of an output of the second storage circuit 1230L and the signal ptx_sh. The signal ptx2i is generated as a logical OR of a logical AND of the first storage circuit 1221L and the signal ptx_rd_1 and a logical AND of an output of the second storage circuit 1231L and the signal ptx_sh.

A configuration of the row selection unit 20R different from that of the row selection unit 20L will be described. Since the row selection unit 20R controls the pixels in the even-numbered rows of the pixel array 10, it is different from the row selection unit 20L in that signals output from a pixel pulse generation unit 25R are supplied to the pixels in the even-numbered rows. Therefore, a second storage unit 23R receives a signal platen_sh_2 instead of the signal platen_sh_1 supplied to the second storage unit 23L. Similarly, the pixel pulse generation unit 25R receives a signal ptx_rd_2 instead of the signal ptx_rd_1 supplied to the pixel pulse generation unit 25L. To the other units, the same signals are supplied to the row selection units 20L and 20R.

Note that the signals platen_rd, platen_sh_1, platen_sh_2, platrst_sh, platen_shf, ptx_rd_1, ptx_rd_2, ptx_sh, pres_rd, pres_sh, and psel are generated by the timing generation unit 40.

Figure 3:
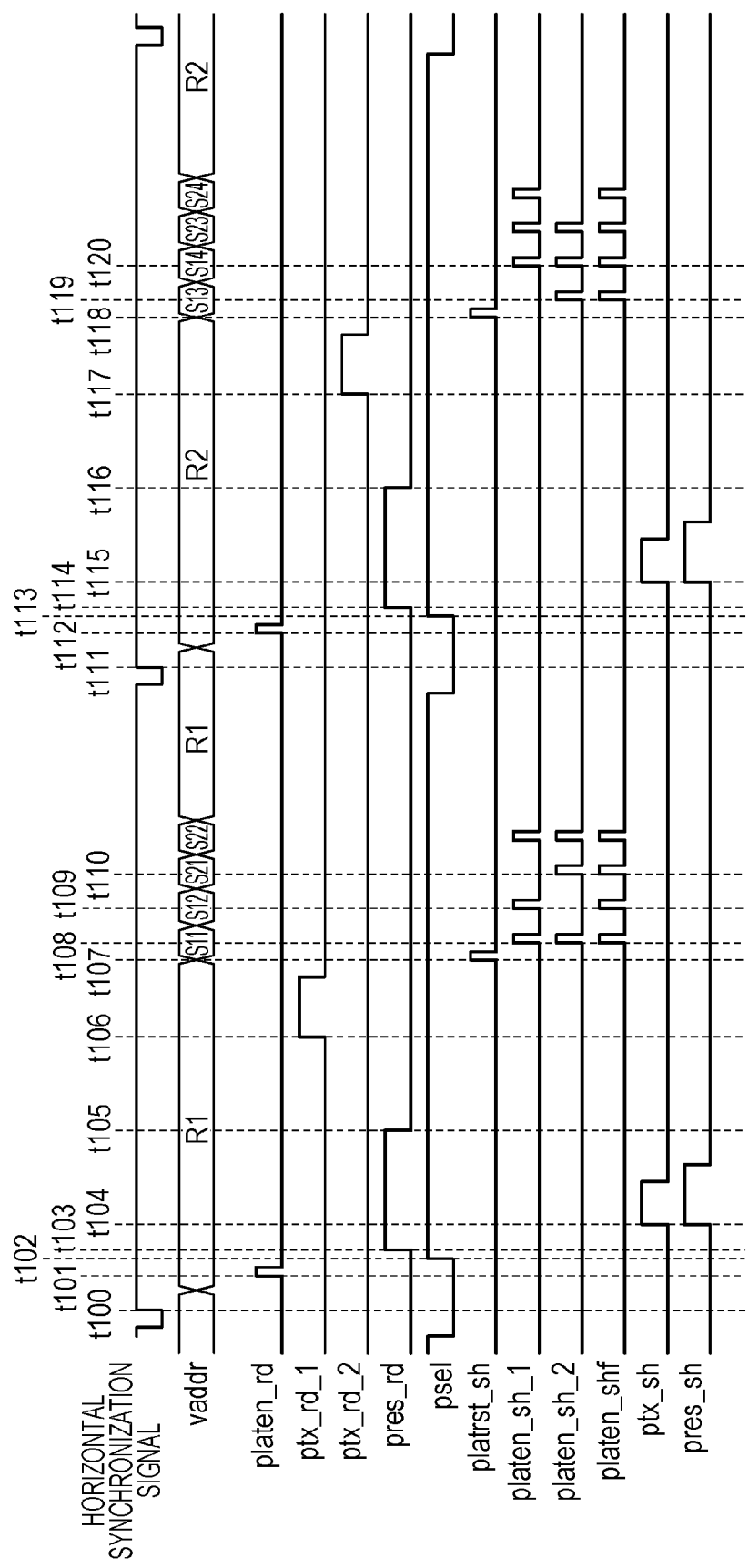
FIG. 3 is a timing chart illustrating an operation of the image pickup device according to the first embodiment.

Next, an operation of the image pickup device 1 shown in FIGS. 1 and 2 will be described with reference to a timing chart shown in FIG. 3. When reference characters L and R are not particularly described in a description below, the row selection units 20L and 20R perform the same operation.

Here, a case where, in the pixel array 10, signals are read from pixels in a first row, a fourth row, a seventh row, and so on, and an shutter operation is performed on, in addition to a group of the first to third rows, a group of the fourth to sixth rows, a group of the seventh to ninth rows, and so on, a group of N-th to (N+2)-th rows, a group of (N+3)-th to (N+5)-th rows, a group of (N+6)-th to (N+8)-th rows, and so on will be described as an example. The shutter operation means reset of the photodiodes and is also referred to as initialization of the pixels. It is assumed that, at a time t100 shown in FIG. 3, the SR latches included in the second and third storage units 23 and 24 maintain a low level.

First, a horizontal synchronization signal is supplied from an external device, not shown, to the timing generation unit 40 at the time t100, the timing generation unit 40 brings the signal platen_rd into a high level at a time t101. At a time t102, since a value R1 of the address signal vaddr supplied from the address generation unit 30 is "0", only the outputs vdecu(0) and vdec(0) among outputs of the address decoder 21 are brought to a high level. That is, an output of the D latch of the first storage circuit 1220 is brought to a high level. The horizontal synchronization signal defines a horizontal synchronization period in which signals corresponding to pixels for a row are read.

When the signal psel is brought to a high level at the time t102, a selection transistor M1105 included in the pixel block 1100 is brought to a high level due to a logical AND of outputs of the D latches included in the first storage circuits 1220L and 1220R and the signal psel. Therefore, an amplifying transistor M1103 included in the pixel block 1100 forms the source follower together with the current source, not shown, connected to the vertical signal lines vline(n), and supplies a signal corresponding to a potential of an FD portion F1101 to a corresponding one of the vertical signal lines vline(n).

When the signal pres_rd is brought to a high level at a time t103, the signal pres(0) to be supplied to the pixel block 1100 is brought to a high level due to a logical AND of the signal pres_rd and outputs of the first storage circuits 1220L and 1220R.

In a period of time from the time t103 to the time t105, the reset transistor M1104 included in the pixel block 1100 is brought to a conductive state and the FD portion F1101 is reset. Here, a signal having a level corresponding to the reset of the FD portion F1101 is supplied to a corresponding one of the vertical signal lines vline(n), and the signal includes a noise component generated by the reset transistor M1104, an amplifying transistor M1103, and the FD portion F1101. In a configuration where the horizontal transfer unit 50 includes a CDS circuit, signals supplied to the vertical signal lines vline(n) in this period are sampled.

When a signal ptx_rd_1 is brought to a high level at a time t106, the signal ptx1(0) to be supplied to the pixel block 1100 is brought to a high level due to a logical AND of the signal ptx_rd_1 and an output of the latch included in the first storage circuit 1220L, and therefore, a transfer transistor M1001-1 is brought to a conductive state. By this, charges stored in the photodiode D1101 is transferred to the FD portion F1101, and accordingly, a potential of the FD portion F1101 is changed, and a level of a signal supplied to a corresponding one of the vertical signal lines vline(n) is changed. The signal is changed by an amount of charges generated by photoelectric conversion relative to a level obtained immediately after the FD portion F1101 is reset. Accordingly, a noise component can be reduced by obtaining a difference between the signal and a noise component stored in a CDS circuit.

At a time t107, the value of the address signal vaddr supplied from the address generation unit 30 is changed from R1 to S11. Note that "S11" represents an address of a pixel to be reset (to be subjected to the shutter operation) and is "0" at this point. Accordingly, among the signals supplied from the address decoder 21, only the signals vdecu(0) and vdec(0) are brought to a high level.

Furthermore, at the time t107, a signal platrst_sh is brought to a high level, and accordingly, the SR latches of the second and third storage units 23 and 24 are reset.

At a time t108, the signals platen_sh_1, platen_sh_2, platen_shf are brought to a high level. Outputs of the SR latches included in the second storage circuits 1230L and 1230R are brought to a high level due to a logical AND of the signals platen_sh_1, platen_sh_2 and the signal vdec(0). Furthermore, outputs from the third storage circuits 1240L and 1240R are brought to a high level due to a logical AND of the signals platen_shf and vdecu(0).

Thereafter, the value of the address signal vaddr supplied from the address generation unit 30 is changed to S12. Here, the value S12 is "1". Accordingly, among the signals supplied from the address decoder 21, only the signals vdecu(0) and vdec(1) are brought to a high level.

At a time t109, the signals platen_sh_1 and platen_shf are brought to a high level. An output from the SR latch of the second storage circuit 1231L is brought to a high level due to a logical AND of the signals platen_sh_1 and vdec(1). Furthermore, outputs from the SR latches of the third storage circuits 1240L and 1240R are brought to a high level due to a logical AND of the signals platen_shf and vdecu(0).

Through the operations performed from the time t107 to the time t109 described above, the second storage circuits 1230L, 1230R, and 1231L and the third storage circuits 1240L and 1240R corresponding to the pixels included in the first to third rows are set to a high level.

It should be noted that addresses corresponding to the pixels in the third row are set using the value S12 and the second storage circuit 1231L is set using the signal platen_sh_1, and simultaneously, the third storage circuits 1240L and 1240R are set using the signal platen_shf. In this embodiment, the pixels included in the first to third rows are reset in the pixel block 1100 in order to reset the first to third rows but the pixels included in the fourth row are not reset. In the configuration disclosed in PTL 1, reset transistors are intended to be turned on for pixels in first to third rows whereas the reset transistors are intended to be turned off for pixels in a fourth row, and therefore, an invalid operation may be performed. On the other hand, in the present invention, the third storage unit is provided in order to control the transistors shared by a plurality of pixels included in the pixel block. Therefore, even in a case where some pixels included in a pixel block are reset but the other pixels are not reset, a proper operation can be performed.

From a time t110, the operation starting from the time t107 is similarly performed on the N-th to (N+2)-th rows so that the latches of the second and third storage units are set. By the operation described above, pixels in six rows including the first to third rows and the N-th to (N+2)-th rows are set to be pixels to be subjected to the shutter operation. In FIG. 3, an example in which the address signal vaddr is set to S22, and thereafter, is changed to R1 is shown. However, the value of the address signal vaddr may remain as S22.

The timing generation unit 40 causes the CDS circuit described above to perform a sampling operation after the signal ptx_rd__1 which has been brought into the high level at the time t106 is brought to a low level. Then, after signals which have been processed by the CDS circuit are stored in a line memory, the timing generation unit 40 controls the horizontal transfer unit 50 such that the horizontal transfer unit 50 outputs signals corresponding to the pixels in the first row from the output terminal OUT.

At a time t111, an operation of reading pixels in a fifth row is started. The reading operation performed on the fourth row is the similar to that performed on the first row described with reference to the time t100 to t111.

Since the pixels included in the fourth row are included in the fourth row of the pixel block 1100, the signal ptx_rd—2 is supplied instead of the signal ptx_rd__1 at the time t117. Furthermore, from the time t118, the second and third storage units corresponding to the pixels included in the fourth to sixth rows and the (N+3)-th to (N+5)-th rows are set. However, since the pixels in the fourth row is included in the fourth row of the pixel block 1100, timings when the signals platen_sh__1 and platen_sh__2 are supplied are different from those in the reading operation performed on the second row.

When the signals ptx_sh and pres_sh are brought to a high level at the time t115, the reset transistors and the transfer transistors of the pixels included in the first to third rows and the N-th to (N+2)-th rows are turned on. Accordingly, the pixels in the first to third rows and the N-th to (N+2)-th rows are reset.

As described above, according to the present embodiment, since the addresses are stored in the third storage unit for controlling the shared elements included in the same pixel block, even when pixels to be reset and pixels not to be reset are included in the same pixel block, a proper operation can be performed.

Second Embodiment

Figure 4:
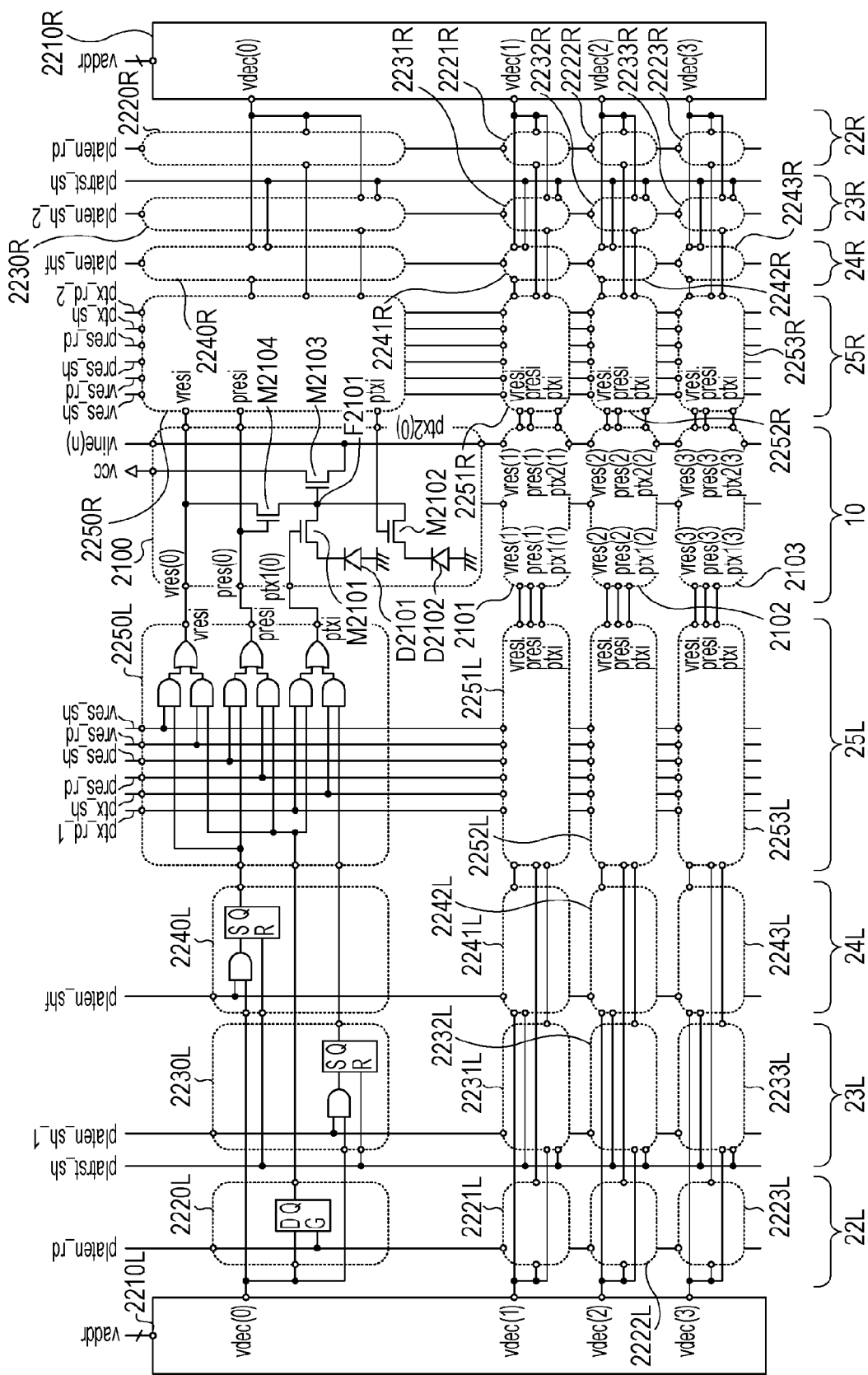
FIG. 4 is a circuit diagram illustrating a configuration of an image pickup device according to a second embodiment.

With reference to the drawings, a second embodiment of the present invention will be described. FIG. 4 is a circuit diagram of the configuration shown in FIG. 1 in detail except for the timing generation unit 40 and the horizontal transfer unit 50.

A pixel array 10 includes a plurality of pixel blocks 2100, 2101, and so on arranged therein. In FIG. 4, pixel blocks arranged in a matrix of four rows and one column are extracted. The pixel block 2100 includes two pixels. A pixel in a first row includes a photodiode D2101 serving as a photoelectric conversion unit, a transfer transistor M2101 serving as a transfer unit, an amplifying transistor M2103 serving as a pixel output unit, and a reset transistor M2104 serving as a reset unit. When the transfer transistor M2101 is brought to a conductive state, a charge stored in the photodiode D2101 is transferred to a node of a gate of the amplifying transistor M2103. Although not shown, on a semiconductor substrate, the gate of the amplifying transistor M2103 is connected to an FD portion serving as a first main electrode of the transfer transistor M2101, and the charge supplied from the photodiode is transferred to the FD portion. The amplifying transistor M2103 has a first main electrode which receives supply of a power supply voltage vcc and a second main electrode connected to a corresponding one of vertical signal lines vline(n). The amplifying transistor M2103 and a current source connected to the vertical signal lines vline(n) form a source follower which outputs a signal corresponding to a potential of the FD portion. The reset transistor M2104 has a first main electrode connected to the FD portion. When being brought to a conductive state, the reset transistor M2104 resets the FD portion based on a potential supplied to a second main electrode thereof. The pixel in the second row includes a photodiode D2102, a transfer transistor M2102, the amplifying transistor M2103 serving as the pixel output unit, and the reset transistor M2104 serving as the reset unit. These two pixels share the amplifying transistor M2103 and the reset transistor M2104. As with the pixel block 2100, each of the pixel blocks 2101, 2102, and so on has two pixels in adjacent two rows which share an amplifying transistor and a reset transistor. As is apparent from this description, the pixels in this embodiment are different from those in the first embodiment in that each of the pixels does not include a selection transistor.

An address decoder 21L receives an address signal vaddr supplied from an address generation unit 30 in accordance with a control signal supplied from the timing generation unit 40. The address signal vaddr is an n-bit signal and has a value corresponding to one of pixels in odd-numbered rows included in the pixel blocks arranged in the pixel array 10. For example, when the address signal vaddr has a value corresponding to "1", the address decoder 21L outputs a signal vdec(1) in a high level and the other outputs signals vdec(0), vdec(2), and so on in a low level.

A plurality of storage circuits 2220L, 2221L, and so on included in a first storage unit 22L include D latches each storing 1-bit data. The D latch included in the storage circuit 2220L has a D terminal connected to an output vdec(0) of the address decoder 21L and a G terminal connected to a line used to transmit a signal platen_rd. As with the storage circuit 2220L, the first storage circuits 2221L, 2222L, and so on each include D latches. However, different outputs are supplied from the address decoder 21L to the different D latches. The line used to transmit the signal platen_rd is also connected in common to the first storage circuits 2221L, 2222L, and so on.

Each of second storage circuits 2230L, 2231L, and so on included in a second storage unit 23L includes an AND circuit and an SR latch having an S terminal connected to an output of the AND circuit. A first input terminal of the AND circuit is connected to the output vdec(0) of the address decoder 21L and a second input terminal is connected to a line used to transmit a signal platen_sh_1. An R terminal of the SR latch is connected to a line used to transmit a signal platrst_sh. The line used to transmit the signal platrst_sh is also connected in common to the second storage circuits 2231L, 2232L, and so on.

Each of third storage circuits 2240L, 2241L, and so on included in a third storage unit 24L includes an AND circuit and an SR latch having an S terminal connected to an output of the AND circuit. A first input terminal of the AND circuit is connected to the output vdec(0) of the address decoder 21L and a second input terminal is connected to a line used to transmit a signal platen_shf. An R terminal of the SR latch is connected to the line used to transmit the signal platrst_sh. The lines which transmit the signals platen_shf and platrst_sh are connected in common to the other storage circuits 2241L, 2242L, and so on included in the third storage unit.

Each of pixel pulse generation circuits 2250L, 2251L, and so on included in a pixel pulse generation unit 25L includes AND circuits and OR circuits. However, configurations of the circuits are not limited to the configuration of this embodiment. The pixel pulse generation circuit 2250L outputs signals vresi, presi, and ptxi which are supplied as signals vres(0), pres(0), and ptxi(0) to the pixel block 2100. The signal vresi is generated as a logical OR of a logical AND of an output of the storage circuit 2220L and a signal vres_rd and a logical AND of an output of the third storage circuit 2240L and a signal vres_sh. The signal presi is generated as a logical OR of a logical AND of the output of the storage circuit 2220L and a signal pres_rd and a logical AND of the output of the third storage circuit 2240L and a signal pres_sh. Furthermore, the signal ptxi is generated as a logical OR of a logical AND of the output of the storage circuit 2220L and a signal ptx_rd_1 and a logical AND of an output of the second storage circuit 2230L and a signal ptx_sh.

Portions of a row selection unit 20R different from those of a row selection unit 20L will be described.

Since the row selection unit 20R controls pixels in even-numbered rows included in the pixel array 10, signals output from a pixel pulse generation unit 25R are input to the pixels in the even-numbered rows, which is different from the row selection unit 20L. Therefore, a signal platen_sh_2 is supplied to a second storage unit 23R instead of the signal platen_sh_1 supplied to the second storage unit 23L. Similarly, a signal ptx_rd_2 is supplied to the pixel pulse generation unit 25R instead of the signal ptx_rd_1 supplied to the pixel pulse generation unit 25L. Other signals supplied to the row selection unit 20R are the same as those supplied to the row selection unit 20L.

Note that the signals platen_rd, platen_sh_1, platen_sh_2, platrst_sh, platen_shf, ptx_rd_1, ptx_rd_2, ptx_sh, pres_rd, pres_sh, vres_rd, and vres_sh are generated by the timing generation unit 40.

Next an operation of the image pickup device 1 shown in FIGS. 1 and 4 will be described with reference to a timing chart shown in FIG. 5. Hereinafter, when reference characters L and R are not particularly described, the row selection units 20L and 20R perform the same operation.

Here, an exemplary case will be described where signals are read from pixels in a second row, a fifth row, an eighth row, and so on in the pixel array 10, and pixels included in three rows including a pixel of interest and before and after the pixel of interest, that is, first to third rows, fourth to sixth rows, seventh to ninth rows, and so on, and in addition, pixels in N-th to (N+2)-th rows, (N+3)-th to (N+5)-th rows, (N+6)-th to (N+8)-th rows, and so on are subjected to a shutter operation. Note that, at a time t200 shown in FIG. 5, the SR latches of the second and third storage units 23 and 24 hold a low level.

When a horizontal synchronization signal is supplied to the timing generation unit 40 from an external device, not shown, at a time t200, the timing generation unit 40 outputs the signal pres_rd at a time t201 and further outputs the signal platen_rd at a time t202. A value R1 of the address signal vaddr supplied from the address generation unit 30 at a time t202 is "0", and therefore, only the output vdec(0) among outputs of the address decoder 21 is brought to a high level. That is, an output of the D latch of the first storage circuit is brought to a high level. Therefore, using a logical AND of the output of the D latch and the signal pres_rd, a signal pres(0) to be supplied to the pixel block 2100 is brought to a high level.

When the signal vres_rd is brought to a high level at a time t203, the signal vres(0) supplied to the pixel block 2100 is brought to a high level due to a logical AND of the signal vres_rd and an output from the first storage circuit 2220.

In a period of time from the time t203 to a time t204, the reset transistor M2104 included in the pixel block 2100 is in a conductive state. Therefore, an FD portion F2101 is reset by the signal vres(0) in the high level, and the pixel block turns to a selected state where an output of this pixel block is supplied to a corresponding one of the vertical signal lines vline(n). Here, the signal having a level corresponding to the reset of the FD portion F2101 is supplied to the vertical signal line vline(n), and the signal includes a noise component generated by the amplifying transistor M2103, the reset transistor M2104, and the FD portion F2101. If the horizontal transfer unit 50 includes a CDS circuit, signals supplied to the vertical signal line vline(n) until the time t205 are subjected to sampling.

When the signal ptx_rd_2 is brought to a high level at the time t205, the signal ptx2(0) to be supplied to the pixel block 2100 is brought to a high level due to a logical AND of the signal ptx_rd_2 and an output of a latch of the first storage circuit 2220R, and therefore, the transfer transistor M2102 is brought to a conductive state. By this, a charge stored in the photodiode D2102 is transferred to the FD portion F2101, and accordingly, a potential of the FD portion F2101 is changed and a level of a signal supplied to the vertical signal line vline(n) is changed. At this time, the level of the signal is changed by an amount corresponding to an amount of charges generated by photoelectric conversion relative to the level obtained immediately after the FD portion F2101 is reset. Therefore, the noise component can be reduced by obtaining a difference between the signal and the noise component stored in the CDS circuit. In this way, an operation of reading signals from the pixels in the second row is completed.

At a time t206, the value of the address signal vaddr supplied from the address generation unit 30 is changed from R1 to S11. The value S11 represents an address of a pixel to be reset (to be subjected to a shutter operation), and the value S11 is "0" at this point. Therefore, among the outputs from the address decoder 21, only the output vdec(0) is brought to a high level.

Furthermore, the signal platrst_sh is brought to a high level at a time t206. By this, the SR latches of the second and third storage units 23 and 24 are reset.

At a time t207, the signals platen_sh_1 and platen_shf are brought to a high level. An output of the SR latch of the second storage circuit 2230L and an output of the SR latch of the third storage circuit 2240 are brought to a high level due to a logical AND of the signal platen_sh_1 and the output vdec(0) and a logical AND of the signal platen_shf and the output vdec(0), respectively.

Thereafter, the value of the address signal vaddr supplied from the address generation unit 30 is changed to S12. Here, the value S12 is "0". Therefore, among outputs from the address decoder 21, only the signal output vdec(0) is brought to a high level.

At a time t208, the signals platen_sh_2 and platen_shf are brought to a high level. An output of an SR latch of a second storage circuit 2230R and an output of the SR latch of the third storage circuit 2240 are brought to a high level.

Thereafter, the value of the address signal vaddr supplied from the address generation unit 30 is changed to S13. Here, the value S13 is "1". Accordingly, among signals output from the address decoder 21, only a signal vdec(1) is brought to a high level.

At a time t209, the signals platen_sh_1 and platen_shf are brought to a high level. An output of the SR latch of the second storage circuit 2231L and an output of the SR latch of the third storage circuit 2241 are brought to a high level due to a logical AND of the signal platen_sh_1 and the signal vdec(1) and a logical AND of the signal platen_shf and the signal vdec(1), respectively.

Through the operation performed in a period of time from the time t206 to the time t209, the second storage circuits 2230L, 2230R, and 2231L and the third storage circuits 2240L, 2240R, and 2241L are set to the high level.

It should be noted that, addresses corresponding to the pixels in the third row are set using the value S13 and the second storage circuit 2231L is set using the signal platen_sh_1, and simultaneously, the third storage circuits 2241L and 2241R are set using the signal platen_shf. Since the first to third rows are to be reset in this embodiment, in the pixel block 2101, the pixels in one of the rows (third row) are reset and the pixels in the other row (fourth row) are not reset. With the configuration disclosed in PTL 1, reset transistors are intended to turned on for the pixels included in the third row whereas the reset transistors are intended to be turned on the pixels included in the fourth row, and accordingly, an invalid operation may be performed. On the other hand, in the present invention, a third storage unit is provided to control transistors shared by a plurality of pixels included in a pixel block. By this, even when some pixels included in a pixel block are reset and the other pixels included in the same pixel block are not reset, a proper operation can be performed.

From a time t210, the same operation is performed on the N-th to (N+2)-th rows and latches of the corresponding second and third storage units are set. By this operation, pixels in six rows, i.e., the first to third rows and N-th to (N+2)-th rows, are set as pixels to be subjected to the shutter operation. In FIG. 5, a case where the value of the address signal vaddr is changed to R1 after the address signal vaddr is set to a value S23 is shown. However, the value may remain as S23.

The timing generation unit 40 causes the CDS circuit described above to perform a sampling operation after the signal ptx_rd_2 which has been brought to the high level at the time t205 is brought to a low level. Then, the timing generation unit 40 controls the horizontal transfer unit 50 so that after the signals which have been processed by the CDS circuit are stored in a line memory, the signals corresponding to the pixels in the second row are output from an output terminal OUT.

At a time t211, an operation of reading pixels in a fifth row is started. The reading operation performed on the fifth row is the same as the reading operation performed on the second row which is performed in a period from the time t200 to the time t211.

Since the pixels in the fifth row are included in a first row of the pixel block 2102, the signal ptx_rd_1 is supplied at a time t218 instead of the signal ptx_rd_2. Furthermore, although, from a time t219, second and third storage units corresponding to the fourth to sixth rows and (N+3)-th to (N+5)-th rows are set, since the pixels in the fourth row correspond to a second row of the pixel block 2101, timings when the signals platen_sh_1 and platen_sh2 are supplied are different from those of the reading operation performed on the second row.

When the signal vres_sh is brought to a high level at a time t214, signals vresi corresponding to the pixels in the first to third rows and the N-th to (N+2)-th rows are brought to a high level due to respective logical ANDs of the signal vres_sh and respective outputs of the third storage unit 24 corresponding to the first to third rows and the N-th to (N+2)-th rows.

When the signals ptx_sh and pres_sh are brought to a high level, reset transistors and transfer transistors of the pixels in the first to third rows and the N-th to (N+2)-th rows are turned on due to logical ANDs of the signals ptx_sh and pres_sh and respective outputs of the second storage unit and individual outputs of the third storage unit, respectively. By this, the pixels in the first to third rows and the N-th to (N+2)-th rows are initialized. Thereafter, the signal ptx_sh is brought to a low level, and the transfer transistors are turned off.

Although the signal vres_sh is brought to a low level at a time t216, since the signal pres_sh is in a high-level state till a time t217, potentials of FD portions of the pixels in the first to third rows and the N-th to (N+2)-th rows are changed to potentials corresponding to the signal vres_sh in the low level. Since a potential of the signal vres_sh in the low level is set so that the amplifying transistors are not turned on, the pixels in the first to third rows and the N-th to (N+2)-th rows are brought to a non-selected state in a period of time from a time t216 to a time t217. That is, addresses of pixels to be subjected to the shutter operation are stored by performing the operation started at the time t206 and, the shutter operation is performed in the operation started at the time t215, and thereafter, the operation of setting the pixels to the non-selected state is performed by the time t217.

As described above, according to the present embodiment, since addresses are stored in the third storage unit for controlling the shared element in the same pixel block, even when some pixels are reset and the other pixels are not reset in the same pixel block, a proper operation can be performed.

Third Embodiment

A third embodiment of the present invention will be described with reference to the accompanying drawings. An operation of this embodiment is different from that of the second embodiment. Hereinafter, portions different from those of the second embodiment will be mainly described.

Figure 5:
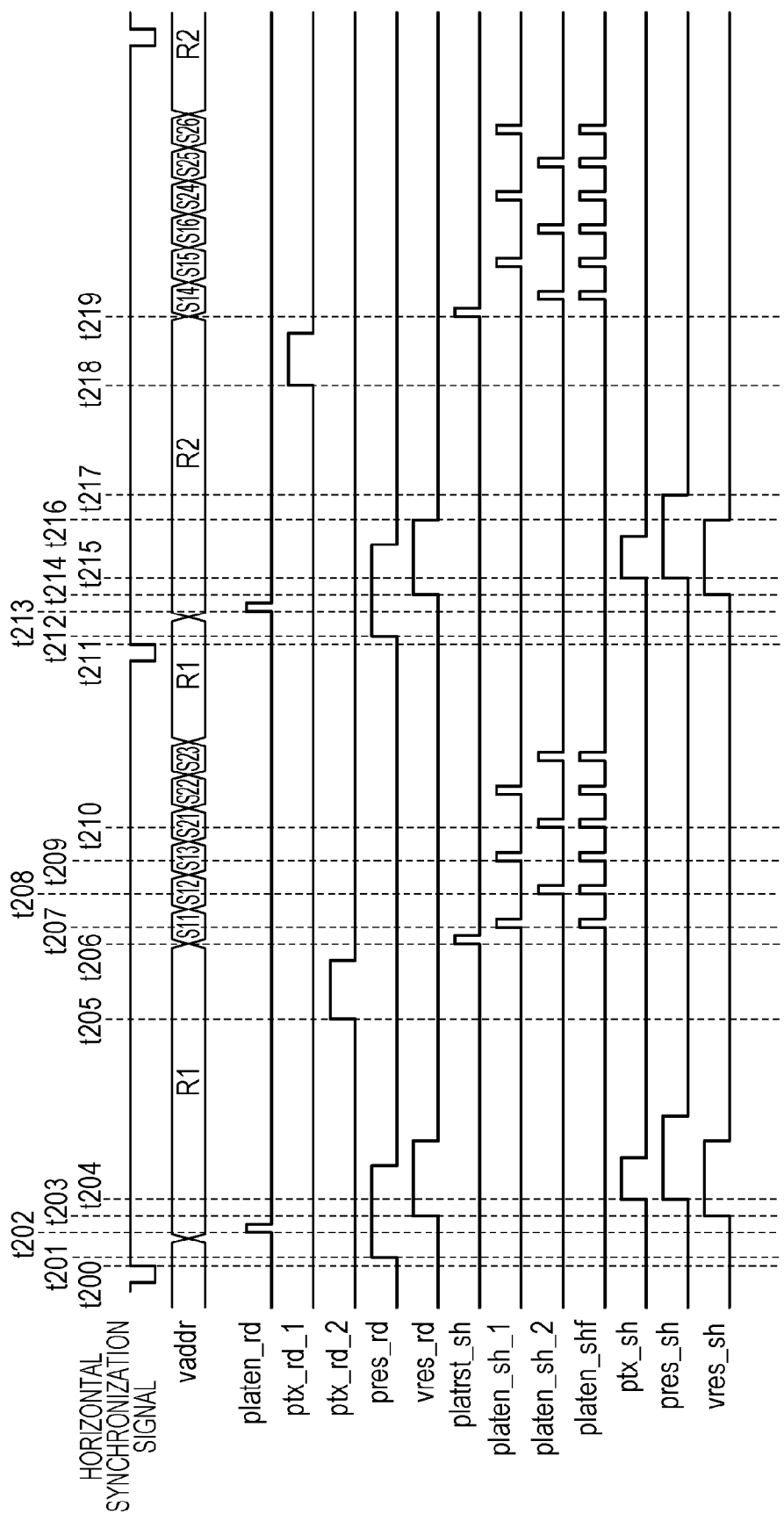
FIG. 5 is a timing chart illustrating an operation of the image pickup device according to the second embodiment.
Figure 6:
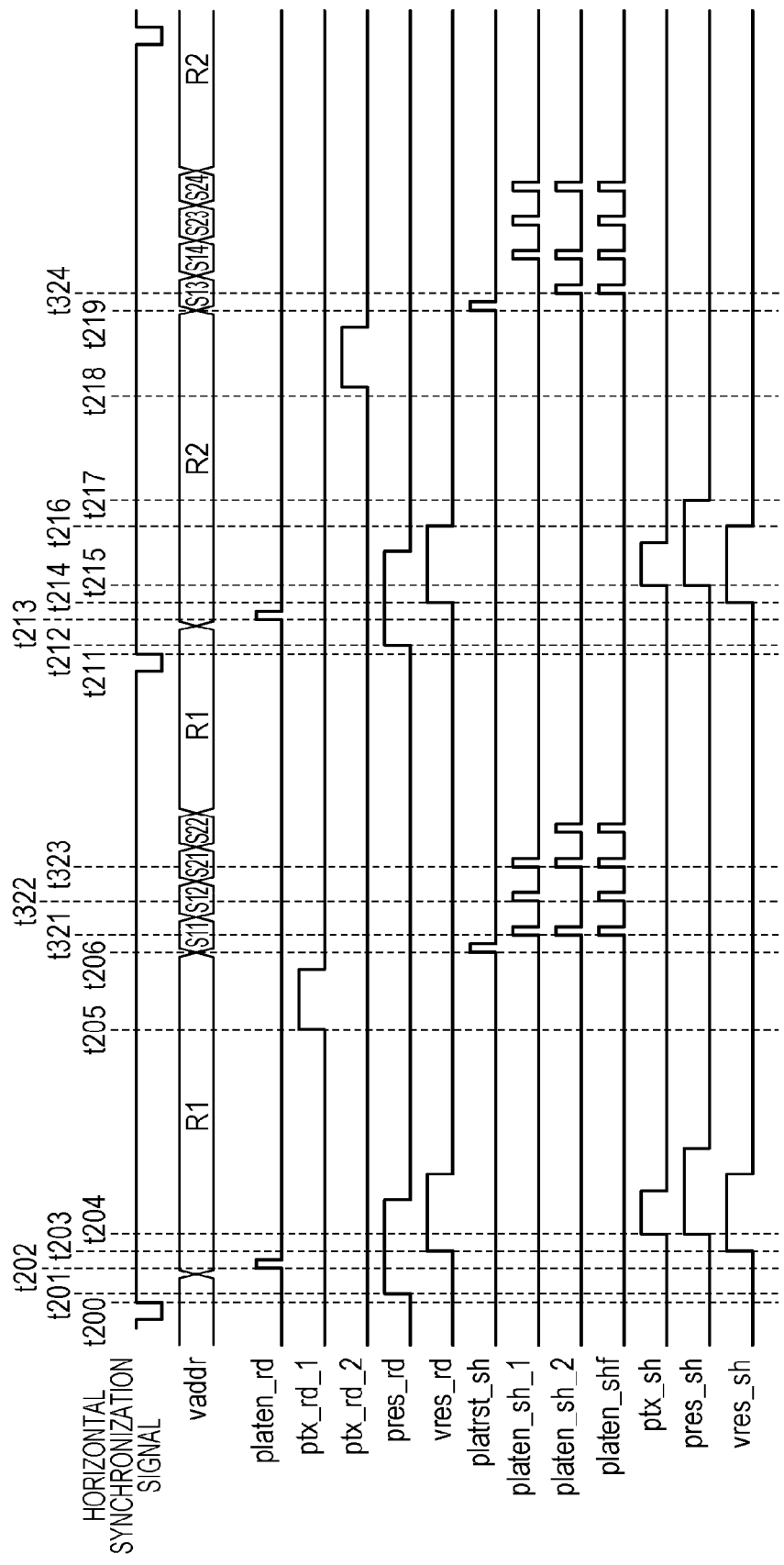
FIG. 6 is a timing chart illustrating an operation of an image pickup device according to a third embodiment.

FIG. 6 is a timing chart illustrating an operation of an image pickup device according to this embodiment. Timings when operations the same as those shown in FIG. 5 are performed are denoted by reference numerals the same as those shown in FIG. 5. As with the second embodiment, an exemplary case will be described where signals are read from pixels in a second row, a fifth row, an eighth row, and so on in a pixel array 10, and pixels corresponding to three rows including a row of interest having the pixels in which the reading is performed and rows before and after the row of interest, that is, first to third rows, fourth to sixth rows, seventh to ninth rows and in addition N-th to (N+2)-th rows, (N+3)-th to (N+5)-th rows, (N+6)-th to (N+8)-th rows are subjected to a shutter operation (reset of photodiodes). At a time t200 shown in FIG. 6, SR latches of second and third storage units 23 and 24 hold a low level.

In this embodiment, an operation starting from a time t321 after time t206 is different from the second embodiment.

In the second embodiment, the SR latches of the second storage circuit 2230L and the third storage circuit 2240 are set at the time t207, and thereafter, the SR latches of the second storage circuit 2230R and the third storage circuit 2240 are set at the time t208.

On the other hand, in this embodiment, signals platen_sh_1 and platen_sh_2 are brought to a high level at the time 321 whereby SR latches of second storage circuits 2230L and 2230R are set. In the operation of the second embodiment, three operations are required for setting the shutter-row addresses of the first to third rows. However, according to this embodiment, addresses of three shutter rows can be set through two operations.

According to this embodiment, since addresses are stored in a third storage unit so that shared elements in the same pixel block are controlled, even when some pixels are reset and the other pixels are not reset in the same pixel block, a proper operation may be performed. Furthermore, according to this embodiment, since shutter-row addresses can be set within a shorter period of time when compared with that of the second embodiment, high-speed performance of the image pickup device can be attained.

Fourth Embodiment

Figure 7:
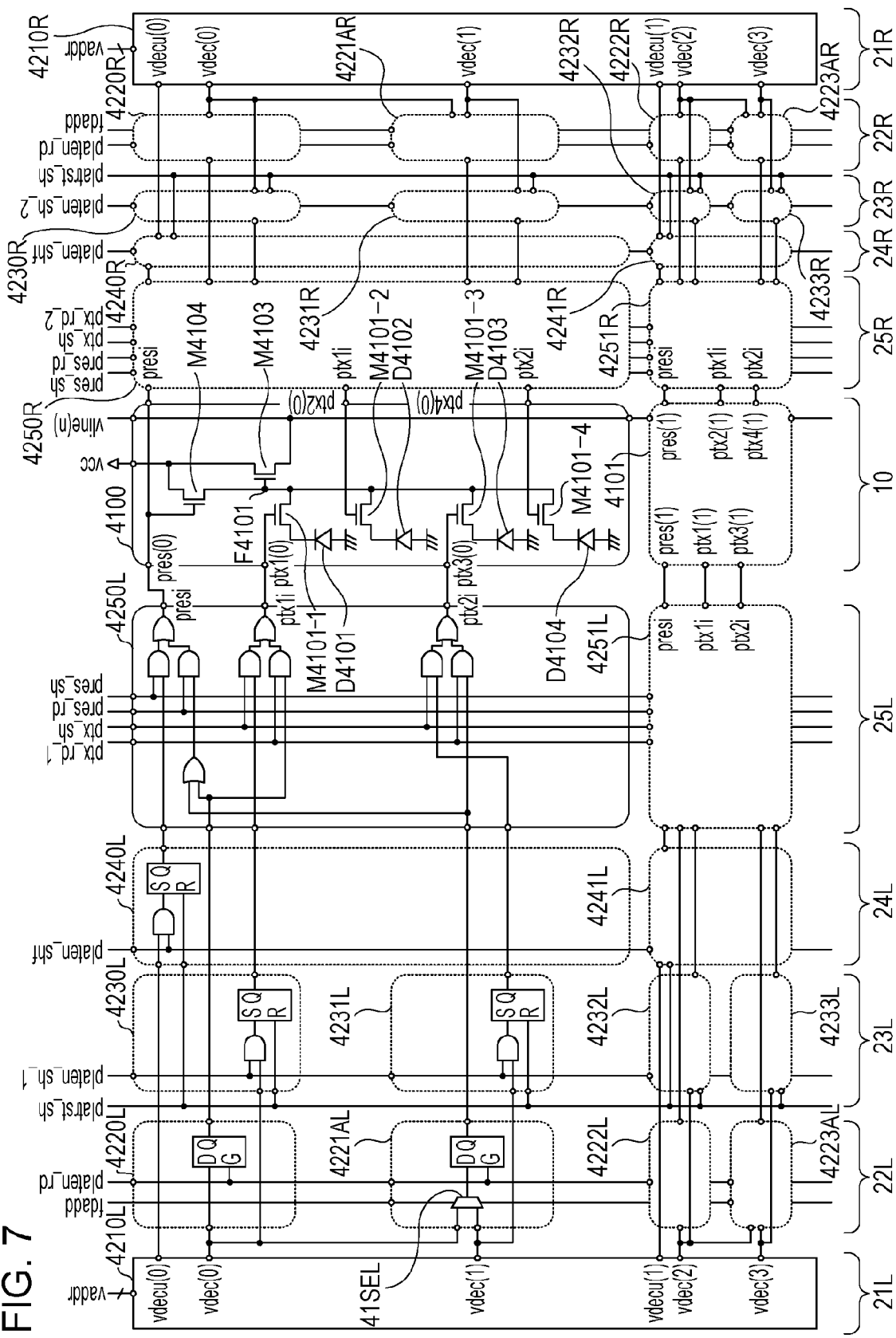
FIG. 7 is a circuit diagram illustrating a configuration of an image pickup device according to a fourth embodiment.

A fourth embodiment of the present invention will be described with reference to the accompanying drawings. FIG. 7 is a circuit diagram of the configuration shown in FIG. 1 in detail except for the timing generation unit 40 and the horizontal transfer unit 50. Hereinafter, portions different from the second embodiment will be mainly described.

In an image pickup device of this embodiment, pixels in adjacent four rows share an amplifying transistor M4103 and a reset transistor M4104 and constitute a single pixel block, which is different from the image pickup device shown in FIG. 4. Furthermore, in this embodiment, a first main electrode of the amplifying transistor M4103 and a first main electrode of the reset transistor M4104 are connected to each other and receive a power supply voltage vcc.

Furthermore, a configuration of an address decoder is different from the address decoder 21 of the image pickup device shown in FIG. 4. An address decoder 21L of this embodiment receives an address signal vaddr output from an address generation unit 30 in accordance with a control signal supplied from a timing generation unit 40. The address signal vaddr is an n-bit signal, for example, and represents a pixel block using higher n−1 bits and represents pixels included in the pixel block using n bits. In FIG. 7, a value vdecu(x) is set using higher n−1 bits ($0 \leq x \leq (2^{(n-1)})-1$), and a value vdec (y) is set using n bits ($0 \leq y \leq (2^n)-1$). Note that, when a pixel block includes two pixels, the pixel block is represented by m bits of an address signal having m bits.

Furthermore, the image pickup device of this embodiment is different from that of the second embodiment in that a first storage unit 22L has selectors which select signals input to D terminals of D latches so that charges stored in a plurality of photodiodes included in the same pixel block can be added to one another.

The first storage unit 22L includes first storage circuits 4220L, 4222L, and so on which do not include selectors and first storage circuits 4221AL, 4223AL, and so on which include selectors. A D latch included in the first storage circuit 4220L has a D terminal connected to an output vdec(0) of the address decoder 21L and a G terminal connected to a line used to transmit a signal platen_rd. On the other hand, a D latch included in the first storage circuit 4221AL has a D terminal connected to an output terminal of a selector 41SEL and a G terminal connected to the line used to transmit the signal platen_rd. The selector 41SEL is connected to the output terminal vdec(0) and an output terminal vdec(1) among output terminals of an address decoder 4210L and transmits an output from the output terminal vdec(0) or vdec(1) to the D latch using a signal fdadd. The selector 41SEL outputs the signal vdec(0) when the signal fdadd is in a high level whereas the selector 41SEL outputs the signal vdec(1) when the signal fdadd is in a low level. The first storage circuits 4222L, 4223AL, and so on are similarly configured. Note that the line used to transmit the signal platen_rd is connected in common to the other storage circuits 4222L, 4223AL, and so on included in the first storage unit 22L. Furthermore, a line used to transmit the signal fdadd is also connected to the other storage circuits 4223AL and so on included in the first storage unit 22L.

Although a case where each of pixel pulse generation circuits 4250L, 4251L, and so on included in a pixel pulse generation unit 25L has AND circuits and OR circuits is described as an example, configurations of the circuits are not limited to the configuration of this embodiment. The pixel pulse generation circuit 4250L outputs signals presi, ptx1i, and ptx2i which are supplied as signals pres(0), ptx1(0), and ptx3(0) to a pixel block 4100. The signal presi is generated as a logical OR of a logical AND of an output of an OR circuit which outputs a logical OR of the first storage circuits 4220L and 4221AL and a signal pres_rd and a logical AND of an output of a third storage circuit 4240L and a signal pres_sh. The signal ptx1i is generated as a logical OR of a logical AND of an output of the first storage circuit 4220L and a signal ptx_rd_1 and a logical AND of an output of a second storage circuit 4230L and a signal ptx_sh. The signal ptx2i is generated as a logical OR of a logical AND of an output of the first storage circuit 4221L and the signal ptx_rd__1 and a logical AND of an output of the second storage circuit 4231L and the signal ptx_sh.

Portions of a row selection unit 20R which are different from those of a row selection unit 20L will be described. Since the row selection unit 20R controls pixels in even-numbered rows in a pixel array 10, signals output from a pixel pulse generation unit 25R are input to the pixels in the even-numbered rows, which is different from the row selection unit 20L. Therefore, a second storage unit 23R receives a signal platen_sh__2 instead of a signal platen_sh__1 supplied to a second storage unit 23L. Similarly, the pixel pulse generation unit 25R receives a signal ptx_rd__2 instead of a signal ptx_rd__1 supplied to the pixel pulse generation unit 25L. The other signals supplied to the row selection unit 20R are the same as those supplied to the row selection unit 20L.

Note that the signals platen_rd, platen_sh__1, platen_sh__2, platrst_sh, platen_shf, fdadd, ptx_rd__1, ptx_rd__2, ptx_sh, pres_rd, pres_sh, and vcc are controlled by the timing generation unit 40.

Figure 8:
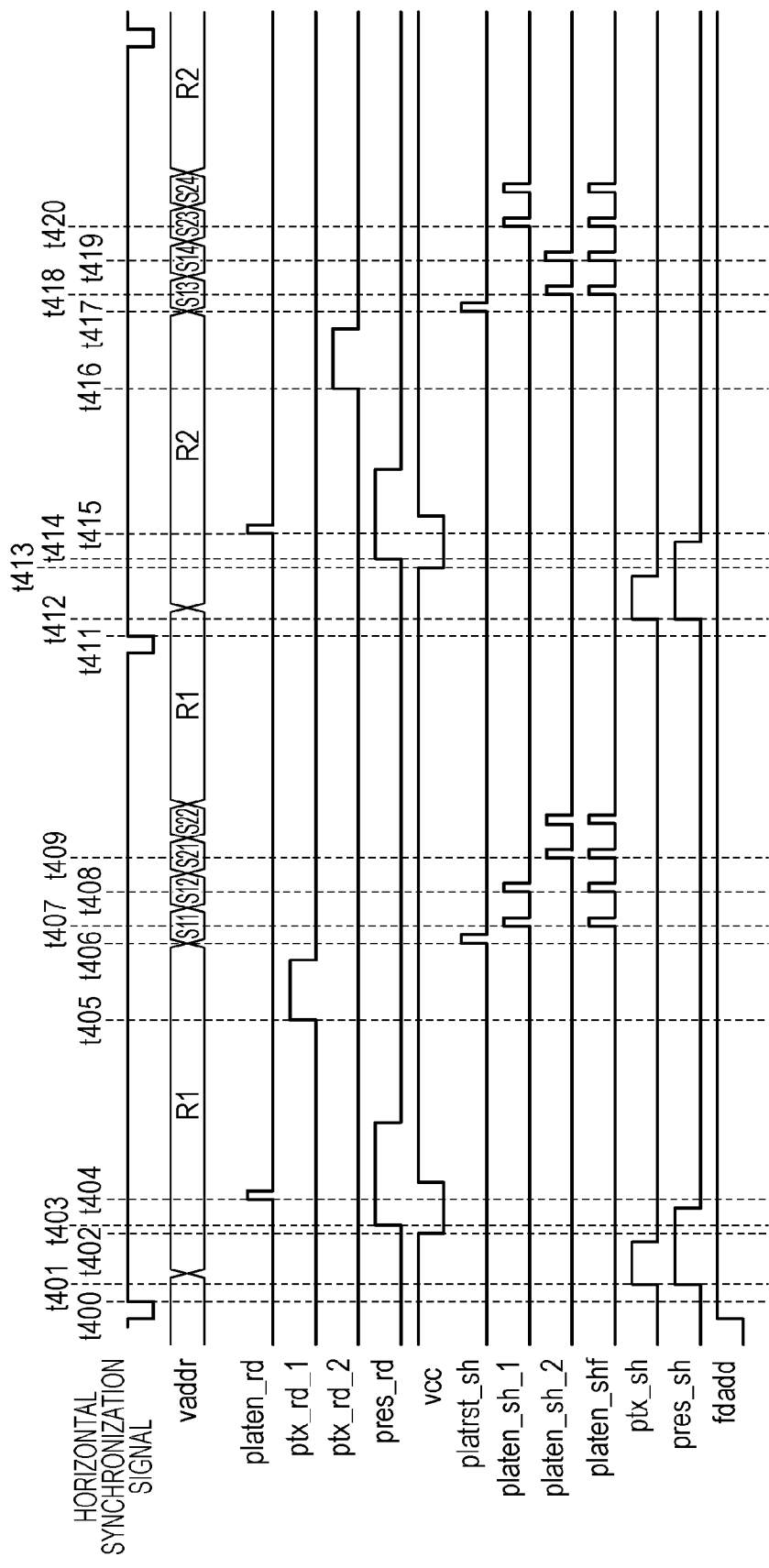
FIG. 8 is a timing chart illustrating an operation of the image pickup device according to the fourth embodiment.

Next an operation of the image pickup device shown in FIGS. 1 and 7 will be described with reference to a timing chart shown in FIG. 8. Hereinafter, when reference characters L and R are not particularly described, the row selection units 20L and 20R perform the same operation.

Here, an exemplary case will be described where signals of pixels in first and third rows, in second and fourth rows, and so on are added to each other and resultant signals are read, and in addition to the pixels the first and third rows, the second and fourth rows, and so on, pixels in N-th and (N+2)-th rows, (N+1)-th and (N+3)-th rows, and so on are subjected to a shutter operation (reset of a photodiode). During a period described below, the signal fdadd is in a high level, the selectors 41SEL, 43SEL, and so on output signals vdec(0), vdec(2), and so on, respectively. It is assumed that, in FIG. 8, at a time t400, SR latches of the second and third storage units 23 and 24 hold a low level.

First, when a horizontal synchronization signal is supplied to the timing generation unit 40 from an external device, not shown, at a time t400, the timing generation unit 40 outputs the signals ptx_sh and pres_sh at a time t401. However, since the SR latches of the second and third storage units maintain the low level, the signals presi, ptx1i, and ptx2i output from the pixel pulse generation unit 25 are in a low level.

At a time t402, a signal vcc is brought to a low level, but an operation of changing a state to a non-selected state is not performed on any pixel block since the signal presi is in the low level.

The signal pres_rd is brought to a high level at a time t403, and the signal platen_rd is brought to a high level at a time t404. Since R1 is "0", among outputs from the address decoder 21L, only the outputs vdecu(0) and vdec(0) are brought to a high level. Here, since the signal fdadd is in a high level, the selector 41SEL outputs a signal vdec(0). Accordingly, when the signal platen_rd is brought to the high level at the time t404, outputs of the D latches of the first storage circuits 4220L and 4221AL are brought to a high level. Since the signal pres_rd is in the high level, the signal pres(0) is brought to a high level due to a logical AND of the signal pres_rd and the output of the first storage circuit 4220L. By this, the reset transistor M4104 of the pixel block 4100 is brought to a conductive state. In this state, when the power supply voltage vcc is brought to a high level, an FD portion F4101 is reset by the power supply voltage vcc, and the pixel block turns to a selected state where a signal output from the pixel block is supplied to a corresponding one of vertical signal lines vline(n). The signal supplied to the vertical signal line vline(n) has a level corresponding to the reset of the FD portion F4101, and the signal includes a noise component generated by the amplifying transistor M4103, the reset transistor M4104, and the FD portion F4101. In a configuration including a horizontal transfer unit 50 having a CDS circuit, the signal supplied to the vertical signal line vline(n) is subjected to sampling until a time t405.

When the signal ptx_rd__1 is brought to a high level at the time t405, the signal ptx1(0) is brought to a high level due to a logical AND of the signal ptx_rd__1 and the output of the first storage circuit 4220L, and in addition, the signal ptx3(0) is brought to a high level due to a logical AND of the signal ptx_rd__1 and an output of the first storage circuit 4221AL. By this, transfer transistors M4101-1 and M4101-3 are brought to a conductive state, and charges stored in photodiode D4101 and D4103 are transferred to the FD portion F4101. A potential of the FD portion F4101 is changed due to the charges transferred thereto, and accordingly, the level of the signal supplied to the vertical signal line vline(n) is changed. The signal is changed by an amount corresponding to an amount of charges generated by photoelectric conversion relative to the level obtained after the FD portion F4101 is reset. Therefore, the noise component can be reduced by obtaining a difference between the signal and the noise component stored in the CDS circuit. In this way, the operation of reading signals from the pixels in the first and third rows is completed.

At a time t406, a value of the address signal vaddr supplied from the address generation unit 30 is changed from R1 to S11. The value S11 represents an address of a pixel to be reset (to be subjected to a shutter operation), and is "0" at this point. Accordingly, among outputs from the address decoder 21, only the signals vdecu(0) and vdec(0) are brought to a high level.

Furthermore, at the time t406, the signal platrst_sh is brought to a high level. By this, the SR latches of the second and third storage units are reset.

At the time t407, the signals platen_sh__1 and platen_shf are brought to a high level, and therefore, outputs of the SR latches of the second storage circuit 4230L and third storage circuits 4240L and 4240R are brought to a high level.

Thereafter, the value of the address signal vaddr is changed from S11 to S12. Here, the value S12 is "1", and among the outputs of the address decoder 21, only the signals vdecu(0) and vdec(1) are brought to a high level.

At a time t408, the signals platen_sh__1 and platen_shf are brought to a high level, and therefore, the SR latches of the second storage circuit 4231L and the third storage circuits 4240L and 4240R are brought to a high level.

Through the operation performed from the time t406 to the time t408, the second storage circuits 4230L and 4231L and the third storage circuits 4240L and 4240R corresponding to the first and third rows are brought to a high level.

It should be noted that addresses corresponding to the pixels in the third row are set using the value S12 and the second storage circuit 4231L is set using the signal platen_sh__1, and simultaneously, the third storage circuits 4240L and 4240R are set using the signal platen_shf. Since the first and third rows in the pixel block 4100 are to be reset in this embodiment, the pixels in the first and third rows are reset and the pixels in the second and fourth rows are not reset. With the configuration disclosed in PTL 1, reset transistors are intended to be turned on for the pixels included in the first and third rows whereas reset transistors are intended to be turned off for the pixels included in the second and fourth rows, and accordingly, an invalid operation may be performed. On the other hand, in the present invention, a third storage unit is provided for controlling the transistors shared by a plurality of pixels included in the pixel block. By this, even when some pixels included in the pixel block are reset and the other pixels included in the pixel block are not reset, a proper operation can be performed.

The operation performed from the time t407 is also performed on the N-th to (N+2)-th rows from a time t409 so that the corresponding latches of the second and third storage units are set. By the operation described above, pixels in total of four rows, i.e., the first and third rows and the N-th and (N+2)-th rows are set as pixels to be subjected to the shutter operation. Here, since the pixels in the N-th row are located in an even-numbered row of the pixel block, the signal platen_sh_2 is supplied instead of the signal platen_sh_1. Although FIG. 8 shows a case where the value of the address signal vaddr which has been set to S22 is changed to R1, the value may remain as S22.

The timing generation unit 40 causes the CDS circuit described above to perform a sampling operation after the signal ptx_rd_1 which has been brought to a high level at the time t405 is brought to the low level. Then, the timing generation unit 40 controls the horizontal transfer unit 50 so that after the signals processed by the CDS circuit are stored in a line memory, the horizontal transfer unit 50 outputs a signal obtained by adding signals corresponding to the pixels in the first and third rows with one another from an output terminal OUT.

At a time t411, a reading operation is started on pixels in the second and fourth rows. The reading operation performed on the second and fourth rows is the same as the reading operation performed on the first and third rows which is performed from the time t400 to the time t411.

Since the pixels in the second and fourth rows are located in the second and fourth rows of the pixel block 4100, the signal ptx_rd_2 is supplied at a time 416 instead of the signal ptx_rd_1.

Furthermore, although the second and third storage units corresponding to the second and fourth rows and the (N+1)-th and (N+3)-th rows are set from a time t417, since the pixels in the second and fourth rows are located in the second and fourth rows of the pixel block 4100, timings when the signals platen_sh_1 and platen_sh_2 are supplied are different from the reading operation performed on the first and third rows. It is assumed here that the pixels in the (N+1)-th and (N+3)-th rows correspond to pixels in the odd-numbered rows of the pixel block.

When the signals ptx_sh and pres_sh are brought to a high level at a time t412, reset transistors and transfer transistors of the pixels in the first and third rows and the N-th and (N+2)-th rows are turned on due to a logical AND of the signals ptx_sh and pres_sh and an output of the second storage unit or the third storage unit. By this, the pixels in the first and third rows and the N-th and (N+2)-th rows are reset.

As described above, according to this embodiment, since the addresses are stored in the third storage unit for controlling the elements which are shared in the same pixel block, even when some pixels in the same pixel block are to be reset and the other pixels in the same pixel block are not to be reset, an appropriate operation can be performed. Furthermore, according to this embodiment, since the selectors are included in the first storage unit, charges of the pixels included in the same pixel block can be added to one another in the FD portion.

In the present and the foregoing embodiments, the pixel selection units 20L and 20R are arranged in opposite sides with the pixel array 10 interposed therebetween for simplicity of the drawings. However, the row selection units 20L and 20R may be arranged in one side of the pixel array 10.

Fifth Embodiment

Figure 9:
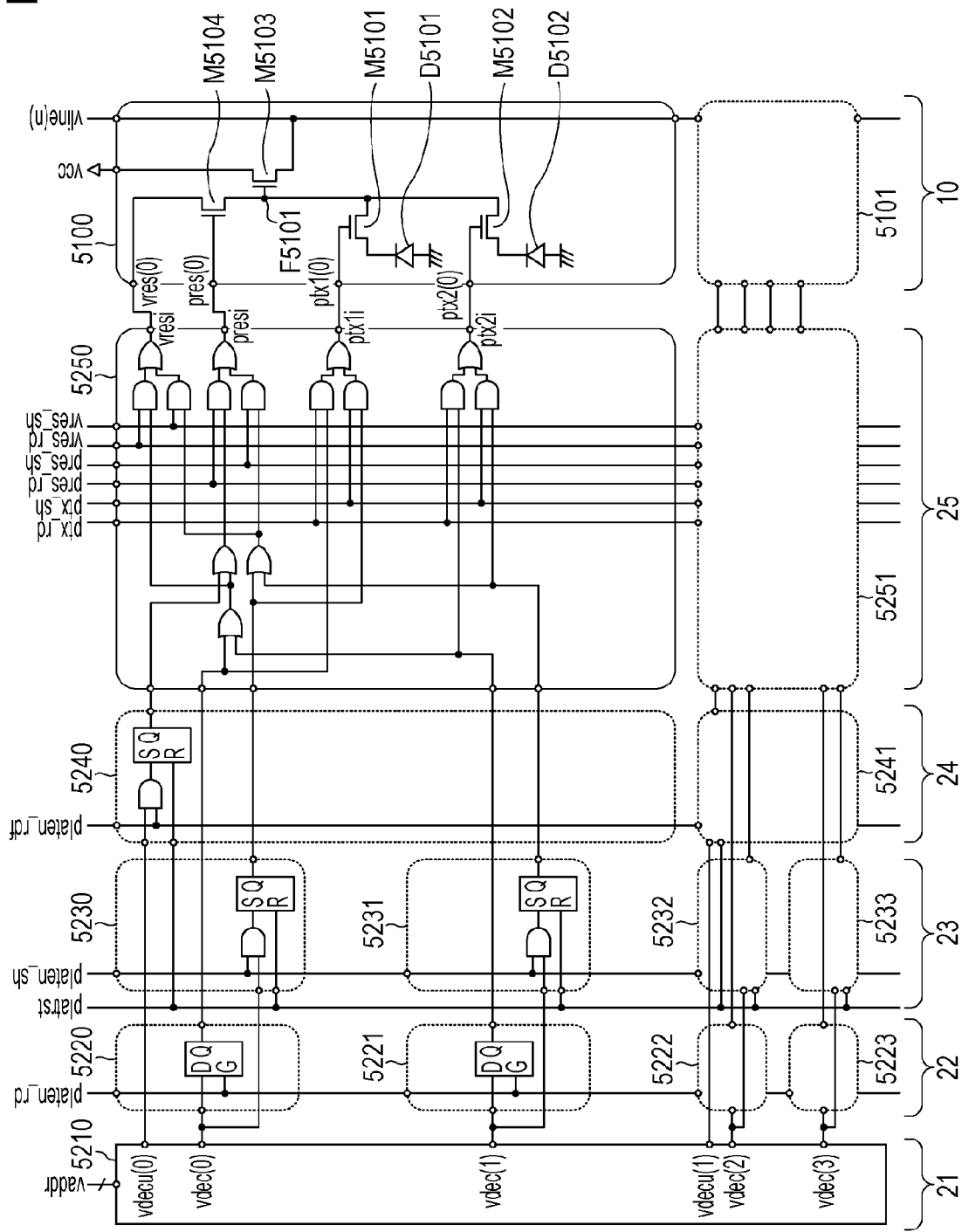
FIG. 9 is a circuit diagram illustrating a configuration of an image pickup device according to a fifth embodiment.

A fifth embodiment of the present invention will be described with reference to the accompanying drawings. FIG. 9 is a circuit diagram of the configuration shown in FIG. 1 in detail except for the timing generation unit 40 and the horizontal transfer unit 50. Hereinafter, portions different from the second embodiment will be mainly described.

In an image pickup device of this embodiment, pixels in adjacent two rows share an amplifying transistor M5103 and a reset transistor M5104 and constitute a pixel block which has a configuration the same as that shown in FIG. 4.

This embodiment is different from the second embodiment in that only a single row selection unit 20 is provided for a pixel array.

Furthermore, the row selection unit 20 includes an address decoder 21, a first storage unit 22, a second storage unit 23, a third storage unit 24, and a pixel pulse generation unit 25. The address decoder 21 decodes an address value generated by an address generation unit 30 and selects an address corresponding to the address value.

The first storage unit 22 stores a result of the decoding performed by the address decoder 21. A signal output from the first storage unit 22 is used as an address of a row included in the pixel array 10 which includes pixels from which signals are to be read.

The second storage unit 23 stores a result of the decoding performed by the address decoder 21. A signal output from the second storage unit 23 is used as an address of a row included in the pixel array 10 which includes pixels having photoelectric conversion units to be reset.

The third storage unit 24 stores a result of the decoding performed by the address decoder 21. A signal output from the third storage unit 24 is used as an address of a pixel block including an FD portion of a pixel which performs a non-selection operation in the pixel array 10.

The address generation unit 30 generates an address value in accordance with a signal supplied from a timing generation unit 40 and supplies the address value to the row selection unit 20.

The timing generation unit 40 supplies a signal used to control a timing when the address generation unit 30 generates an address value and supplies a signal used to control timings when the row selection unit 20 and the horizontal transfer unit 50 operate.

The horizontal transfer unit 50 is used to output a signal read from the pixel array 10 through a corresponding one of vertical signal lines vline(n) from an output terminal OUT. Specifically, the horizontal transfer unit 50 includes amplifiers, AD converters, CDS circuits, sample-and-hold circuits, and the like which are provided for the individual vertical signal lines vline(n), and successively outputs signals to the output terminal OUT using a horizontal scanning circuit.

The address decoder 21 receives an address signal vaddr which is output from the address generation unit 30 in accordance with a control signal supplied from the timing generation unit 40. The address signal vaddr is an n-bit signal representing a pixel block using upper n−1 bits and representing pixels in the pixel block using lower n bits. In FIG. 9, a value vdecu(x) is set using upper n−1 bits and a value vdec(y) is set using lower n bits. Note that when a pixel block includes two pixels, the pixel block is represented by m bits of an address signal of m bits.

Each of a plurality of first storage circuits 5220, 5221, and so on included in the first storage unit 22 includes a D latch which stores one-bit data. The D latch included in the first storage circuit 5220 has a D terminal connected to an output vdec(0) of the address decoder 21 and a G terminal connected to a line used to supply a signal platen_rd. Although the first storage circuits 5221, 5222, and so on also include respective D latches similarly to the storage circuit 5220, the D terminals are connected to different outputs of the address decoder 21. The line used to transmit the signal platen_rd is connected to the other storage circuits 5221, 5222, and so on included in the first storage unit in common.

Each of second storage circuits 5230, 5231, and so on included in the second storage unit 23 has an AND circuit and an SR latch having an S terminal connected to an output of the AND circuit. A first input terminal of the AND circuit is connected to an output vdec(0) of the address decoder 21 and a second input terminal of the AND circuit is connected to a line used to transmit a signal platen_sh. An R terminal of the SR latch is connected to a line used to transmit a signal platrst. The line used to transmit the signal platrst is also connected to the other second storage circuits 5231, 5232, and so on included in the second storage unit in common.

Each of third storage circuits 5240, 5241, and so on included in the third storage unit 24 includes an AND circuit and an SR latch having an S terminal connected to an output of the AND circuit. A first input terminal of the AND circuit is connected to an output vdecu(0) of the address decoder 21 and a second input terminal of the AND circuit is connected to a line used to transmit a signal platen_rdf. An R terminal of the SR latch is connected to the line used to transmit the signal platrst. The lines used to transmit the signals platen_rd and platrst are also connected in common to the other third storage circuits 5241, 5242, and so on included in the third storage unit.

Although a case where each of pixel pulse generation circuits 5250, 5251, and so on included in the pixel pulse generation unit 25 includes AND circuits and OR circuits is shown as an example, configurations of the circuits are not limited to the configuration of this example. The pixel pulse generation circuit 5250 outputs signals vresi, presi, ptx1i, and ptx2i which are supplied as signals vres(0), pres(0), ptx1(0), and ptx2(0), respectively, to a pixel block 5100. The signal vresi is generated as a logical OR of a logical AND of a logical OR of the first storage circuits 5220 and 5221 and a signal vres_rd and a logical AND of a logical OR of the second storage circuit 5230 and 5231 and the signal vres_sh. The signal presi is generated as a logical OR of a logical AND of a logical OR of an output of the OR circuit which outputs the logical OR of the first storage circuits 5220 and 5221 and an output of the third storage circuit 5240 and a signal pres_rd and a logical AND of an output of an OR circuit which outputs the logical OR of the second storage circuits 5230 and 5231 and a signal pres_sh. Then, the signal ptx1i is generated as a logical OR of a logical AND of an output of the first storage circuit 5220 and a signal ptx_rd and a logical AND of an output of the second storage circuit 5230 and a signal ptx_sh. The signal ptx2i is generated as a logical OR of a logical AND of the first storage circuit 5221 and the signal ptx_rd and a logical AND of an output of the second storage circuit 5221 and the signal ptx_sh.

Note that the signals vres_rd, vres_sh, platen_rd, platen_sh, platrst, platen_rdf, ptx_rd, ptx_sh, pres_rd, and pres_sh are generated by the timing generation unit 40.

Figure 10:
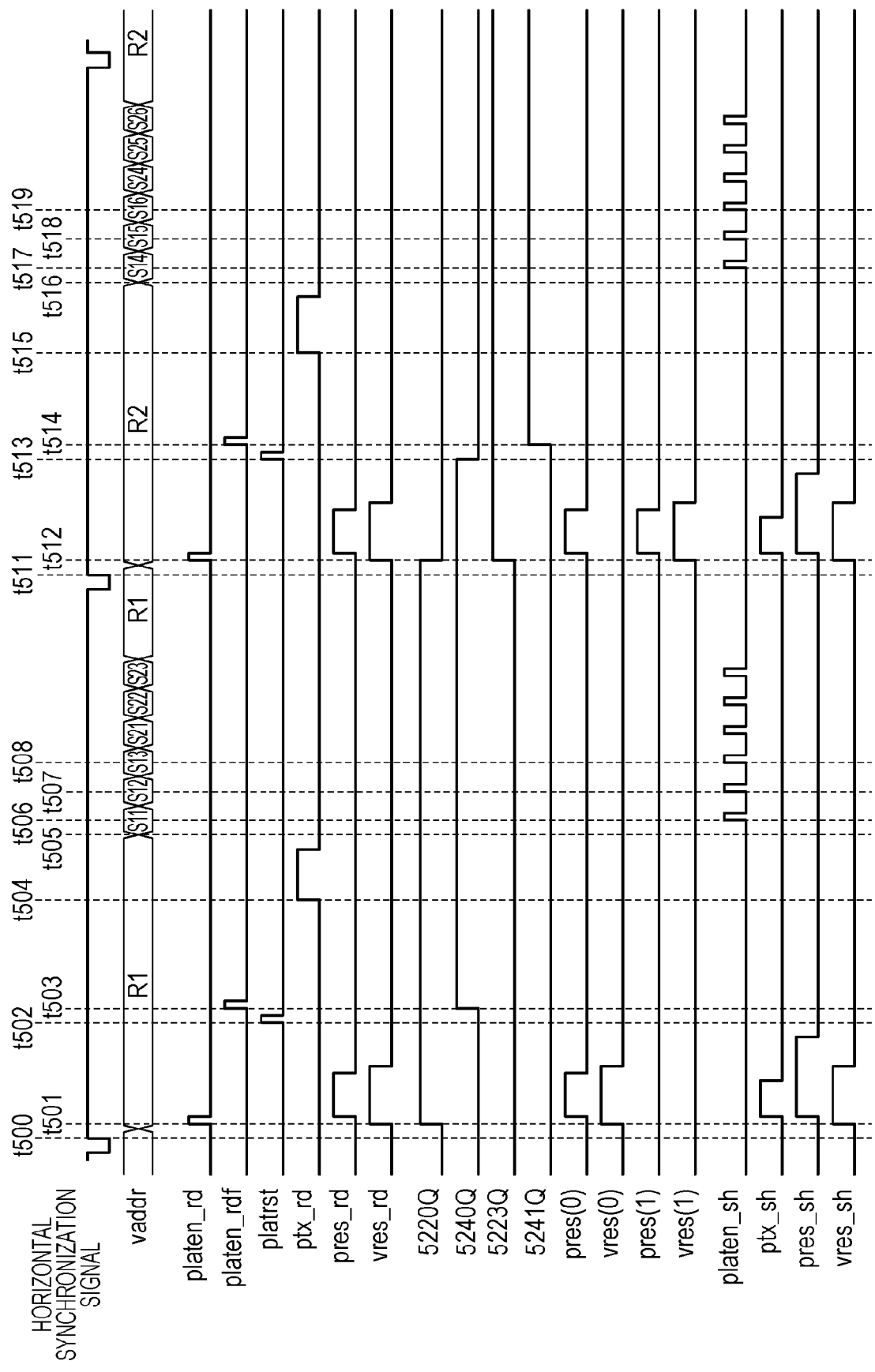
FIG. 10 is a timing chart illustrating an operation of the image pickup device according to the fifth embodiment.

Next, an operation of the image pickup device shown in FIG. 9 will be described with reference to a timing chart shown in FIG. 10.

Here, an exemplary case will be described where signals are read from pixels in a first row, a fourth row, a seventh row, and so on in the pixel array 10, and a shutter operation (reset of photodiodes) is performed on pixels in sixth to eighth rows while the reading operation is performed on the fourth row, a shutter operation is performed on pixels in eleventh to thirteenth rows while the reading operation is performed on a seventh row, and similarly a shutter operation is performed on the following pixels. In FIG. 10, at a time t500, the SR latches of the second and third storage units 23 and 24 maintain a low level.

First, when a horizontal synchronization signal is supplied to the timing generation unit 40 from an external device, not shown, at the time t500, the timing generation unit 40 brings the signal platen_rd to a high level at a time t501. Since a value R1 of the address signal vaddr supplied from the address generation unit 30 at a timing when the signal platen_rd is brought to a low level is "0", only outputs vdecu(0) and vdec(0) among outputs of the address decoder 21 are brought to a high level. That is, an output of the D latch of the first storage circuit 5220 is brought to a high level.

Since the signal vres_rd is brought to a high level at the time t501, the signal vres(0) is brought to a high level due to a logical AND of the signal vres_rd and an output of the first storage circuit 5240.

Furthermore, although the signal vres_sh is brought to a high level at the time t501, the signals vres(n) other than the signal vres(0) remain as a low level since the SR latches of the second storage unit 23 output signals in a low level.

Thereafter, when the signal pres_rd is brought to a high level, the signal pres(0) is brought to a high level due to a logical AND of the signal pres_rd and an output of the first storage circuit 5220. By this, the reset transistor M5104 is brought to a conductive state, and an FD portion is reset in accordance with the signal vres(0) which is in the high level. Here, a signal having a level corresponding to the reset of an FD portion F5101 is supplied to a corresponding one of the vertical signal lines vline(n). The signal includes a noise component generated by the amplifying transistor M5103, the reset transistor M5104, and the FD portion 5101. When the horizontal transfer unit 50 includes a CDS circuit, signals supplied to the vertical signal lines vline(n) by a time t505 are subjected to sampling.

Furthermore, although the signals ptx_sh and pres_sh are brought to the high level along with the signal pres_rd, signals pres(n) other than the signal pres(0) of the SR latches of the second and third units and all signals ptx1(n) and ptx2(n) remain a low level.

When the signal platrst is brought to a high level at a time t502, the SR latches of the second and third storage units are reset.

When the signal platen_rdf is brought to a high level at a time t503, the SR latch of the third storage circuit 5240 is set to a high level due to a logical AND of the signal platen_rdf and the signal vdecu(0).

When the signal ptx_rd is brought to a high level at a time t504 the signal ptx1(0) is brought to a high level due to a logical AND of the signal ptx_rd and an output of the first storage circuit 5220. By this, a transfer transistor M5101 is brought to a conductive state, and charge stored in a photodiode D5101 is supplied to the FD portion F5101. Accordingly a potential of the FD portion F5101 is changed and a level of a signal supplied to a corresponding one of the vertical signal lines vline(n) is changed. Since the signal is changed by an amount corresponding to an amount of a charge generated by photoelectric conversion relative to a level obtained immediately after the FD portion F5101 is reset, a noise component can be reduced by obtaining a difference between the signal and the noise component stored in the CDS circuit. In this way, an operation of reading signals from the pixels in the first row is completed.

At a time t505, a value of the address signal vaddr supplied from the address generation unit 30 is changed from R1 to S11. The value S11 represents an address of a pixel to be reset (to be subjected to a shutter operation) in a next horizontal synchronization period and the value S11 is "5" in this embodiment. Therefore, among the outputs of the address decoder 21, only signals vdecu(2) and vdec(5) are brought to a high level, and the first to third storage circuits corresponding to pixels in the sixth row perform operations.

At a time t506, the signal platen_sh is brought to a high level, and therefore, only the SR latch of the second storage circuit 5235 (not shown) is set to a high level.

From a time t507, the address signal vaddr is changed so as to correspond to pixels in the seventh row, pixels in the eighth row, and pixels in N-th to (N+2)-th rows, and the second storage circuit is set to a high level in accordance with a timing of the signal platen_sh.

Thereafter, in the period after a time t511 when a reading operation is performed on the fourth row and in a period of time when all the signals ptx_sh, pres_sh, and vres_sh are in a high level, photodiodes of the pixels in the sixth to eighth rows and the N-th to (N+2)-th rows are reset.

It should be noted that addresses corresponding to FD portions of pixels subjected to a non-selection operation in a succeeding horizontal synchronization period are stored in the third storage unit using the signal platen_rdf. Before the reading operation is performed from a time t511 on the pixels in the fourth row, a pixel block including the pixels in the first row which have been subjected to the reading operation in a preceding horizontal synchronization period should be set to a non-selected state. This is because, if the pixel block 5100 including the pixels in the first row is not brought to the non-selected state, amplifying transistors of the pixels in the first and fourth rows are turned on, and therefore, a determination as to whether signals corresponding to the pixels in the first row or signals corresponding to the pixels in the fourth row have been supplied to the vertical signal lines vline(n) cannot properly be made, and accordingly, an inappropriate operation may be performed.

For example, in the operation shown in FIG. 5, in a period of time from the time t212 to the time t213, an operation of setting a pixel block corresponding to pixels read in a preceding horizontal synchronization period to a non-selected state is performed. On the other hand, in this embodiment, since the third storage unit stores the addresses corresponding to the pixels to be reset in a succeeding horizontal synchronization period, the period from the time t212 to the time t213 can be omitted and an operation of setting pixels read in a preceding horizontal synchronization period to be a non-selected state can be performed in a period starting from the time t512.

As described above, according to this embodiment, the period of time required for the operation of setting pixels read in a preceding horizontal synchronization period to a non-selected state can be reduced, and accordingly, a horizontal blanking period can be shortened.

Furthermore, any one of concepts of the first to fourth embodiments may be combined with a concept of this embodiment. That is, two third storage units may be used. Similarly, three or more third storage units may be used so as to control elements shared by a plurality of pixels.

Note that the latches included in the first to third storage units in the foregoing embodiments are not limited to the examples. For example, SR latches may be included in all the first to third storage units. As shown in the drawings, in a configuration in which a single vertical signal line is provided for each pixel column, signals are read only from pixels in a single row. Therefore, since the D latches are included in the first storage unit which stores an address of a row including pixels from which signals are to be read, setting and resetting can be simultaneously performed. Furthermore, since the SR latches are included in the second and third storage units, when an output from a decoder is in a high level, the latches are set whereas when the output of the decoder is in a low level, a current value is maintained. Furthermore, by supplying the same reset signal to the plurality of SR latches, states of the latches can be simultaneously reset.

Sixth Embodiment

Figure 11:
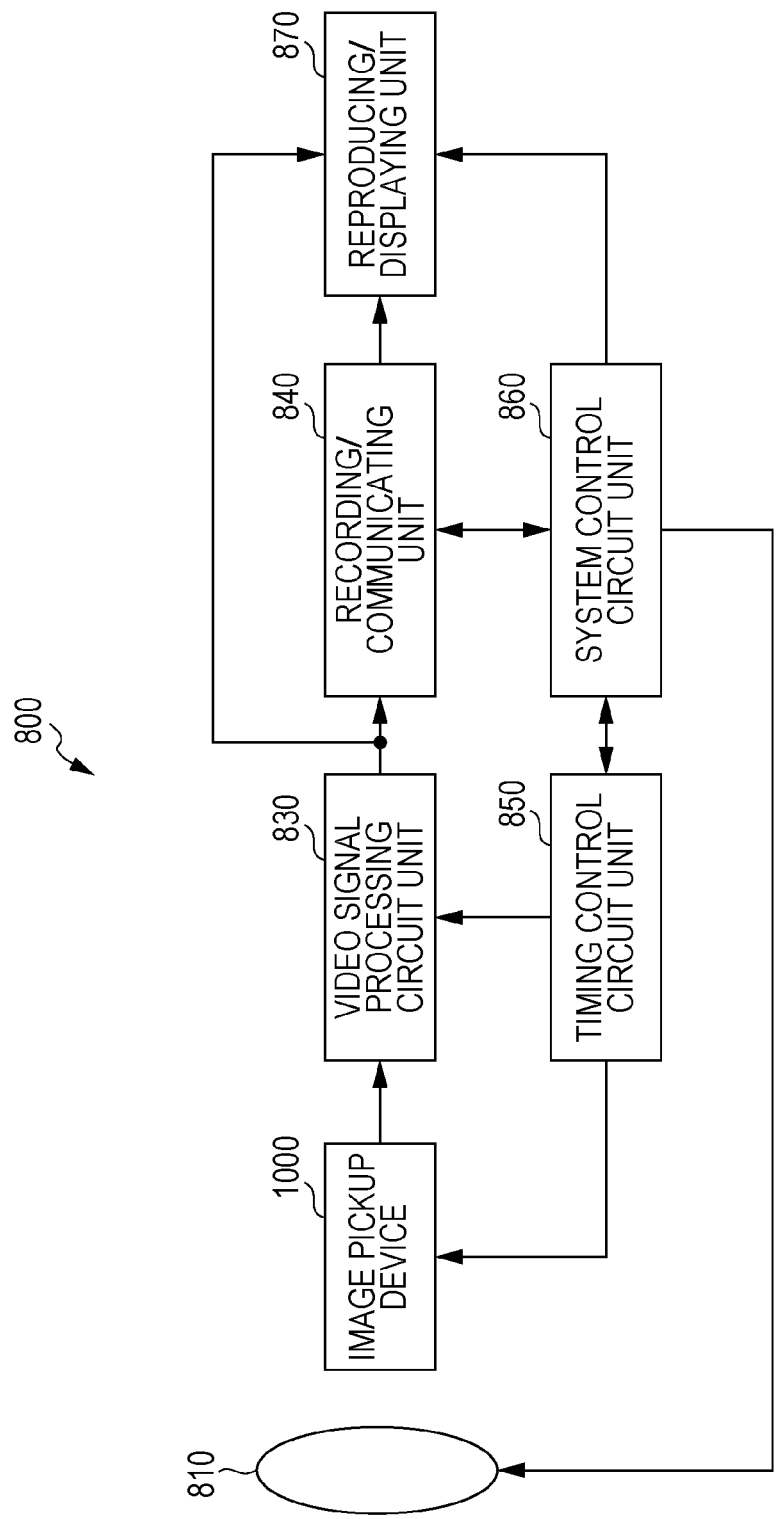
FIG. 11 is a block diagram schematically illustrating an image pickup system according to a sixth embodiment.

An image pickup system of a sixth embodiment will be schematically described with reference to FIG. 11.

An image pickup system 800 includes an optical unit 810, an image pickup device 1000, a video signal processing circuit unit 830, a recording/communicating unit 840, a timing control circuit unit 850, a system control circuit unit 860, and a reproducing/displaying unit 870. Each of the image pickup devices described in the foregoing embodiments are employed as the image pickup device 1000. In this embodiment, a case where the timing generation unit 40 shown in FIG. 1 is included in the timing control circuit unit 850 instead of the image pickup device will be shown as an example.

The optical unit 810 serving as an optical system such as a lens forms an image of an object using light emitted from the object on a pixel array which includes a plurality of pixels arranged in a matrix and which is included in the image pickup device 1000. The image pickup device 1000 outputs a signal corresponding to the light used to form the image on a pixel region at a timing in accordance with a signal output from the timing control circuit unit 850.

The signal output from the image pickup device 1000 is supplied to the video signal processing circuit unit 830 serving as a video signal processor. The video signal processing circuit unit 830 performs processing such as AD conversion on the input electric signal in accordance with a method determined by a program. The signal obtained through the processing performed by the video signal processing circuit unit is supplied as image data to the recording/communicating unit 840. The recording/communicating unit 840 supplies a signal used to form an image to the reproducing/displaying unit 870 which reproduces and displays a movie or a still image. The recording/communicating unit further performs communication with the system control circuit unit 860 when receiving the signal from the video signal processing circuit unit 830, and in addition, performs an operation of recording the signal used to form an image in a recording medium, not shown.

The system control circuit unit 860 integrally controls the operation of the image pickup system and controls driving of the optical unit 810, the timing control circuit unit 850, the recording/communicating unit 840, and the reproducing/displaying unit 870. Furthermore, the system control circuit unit 860 includes a storage device, not shown, serving as a recording medium, for example, which stores programs and the like used to control the operation of the image pickup system. Furthermore, the system control circuit unit 860 supplies a signal used to change a driving mode in response to a user's operation in the image pickup system, for example. Examples of the change of a driving mode include a change of a row to be subjected to reading or to be reset, a change of an angle of field in accordance with an electronic zoom, and a shift of an angle of field in accordance with image stabilizing.

The timing control circuit unit 850 controls a timing when the image pickup device 1000 is driven and a timing when the video signal processing circuit unit 830 is driven under control of the system control circuit unit 860 serving as a controller.

The foregoing embodiments described above are merely examples to embody the present invention, and may be modified and combined with each other within the scope of the present invention. The present invention is not limited to the foregoing embodiments, and various modifications and alternations may be made without departing from the spirit and the scope of the present invention. Accordingly, the following claims are attached to declare the scope of the present invention.

According to the present invention, even when a pixel sharing technique is employed, pixels can be properly selected and an invalid operation can be prevented from being performed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of International Patent Application No. PCT/JP2010/054528, filed Mar. 17, 2010, which is hereby incorporated by reference herein in its entirety.

What is claimed is:

1. An image pickup device comprising:
a pixel array including a plurality of pixels arranged in a matrix; and
a row selection unit which selects a pixel row, where the row selection unit includes:
an address generation unit which generates an address signal corresponding to an address of a pixel row in a time division multiplex method;
a decoder which decodes the address signal generated by the address generation unit and outputs a resultant decoded value;
a first storage unit which stores the decoded value corresponding to the address of a pixel row from which signals are to be read; and
a second storage unit which stores the decoded value corresponding to the address of a pixel row to be initialized,
wherein, among the pixels arranged in a matrix, a plurality of pixels in adjacent rows form a plurality of pixel blocks each with a shared transistor shared by the plurality of pixels, and
the row selection unit further includes a third storage unit which stores the decoded value for controlling the shared transistor.

2. The image pickup device according to claim 1, wherein the third storage unit stores the decoded value of a row corresponding to the shared transistor shared by the plurality of pixels included in the pixel block to be initialized, whose address is stored by the second storage unit.

3. The image pickup device according to claim 1, wherein the third storage unit stores the decoded value of a row corresponding to the shared transistor shared by the plurality of pixels included in the pixel block to be read, whose address is stored by the first storage unit.

4. The image pickup device according to claim 1, wherein each of the pixels includes
a photoelectric conversion unit,
an amplifying transistor which outputs a signal based on a charge generated by the photoelectric conversion unit,
a transfer transistor which transfers the charge generated by the photoelectric conversion unit to a node of a gate of the amplifying transistor, and
a reset transistor which resets the node of the gate of the amplifying transistor, and
a plurality of pixels included in one of the pixel blocks share the amplifying transistor and the transfer transistor.

5. The image pickup device according to claim 4, wherein each of the pixels includes a selection transistor which selects pixels.

6. The image pickup device according to claim 4, wherein the row selection unit controls the reset transistor in accordance with the decoded value stored in the third storage unit.

7. The image pickup device according to claim 1, wherein the row selection unit includes a first row selection circuit which selects a part of the pixel rows and a second row selection circuit which selects the other of the pixel rows.

8. The image pickup device according to claim 7, wherein the first and second row selection circuits are arranged in opposite sides relative to the pixel array so as to sandwich the pixel array therebetween.

9. The image pickup device according to claim 7, wherein the pixel rows in the pixel array are alternately selected by the first and second selection circuits.

10. The image pickup device according to claim 7, wherein the third storage unit included in the first row selection circuit and the third storage unit included in the second row selection circuit are controlled by the same signal.

11. An image pickup system comprising:
the image pickup device according to claim 1;
an optical system which forms an image in a pixel region of the image pickup device; and
a video signal processing unit which processes a signal output from the image pickup device and generate image data.

12. The image pickup system according to claim 11, further comprising:
a timing generation unit,
wherein the timing generation unit outputs a horizontal synchronization signal which defines a horizontal synchronization period in which signals of a number of pixels included in a row are read, and
the image pickup device initializes pixels selected based on the second storage unit while initialization of the pixels from which signals are to be read is performed based on the first storage unit in the same horizontal synchronization period.

* * * * *